(12) United States Patent
Ito et al.

(10) Patent No.: US 8,723,224 B2
(45) Date of Patent: May 13, 2014

(54) SEMICONDUCTOR DEVICE

(75) Inventors: Nobuyuki Ito, Osaka (JP); John Kevin Twynam, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/620,088

(22) Filed: Sep. 14, 2012

(65) Prior Publication Data

US 2013/0009166 A1    Jan. 10, 2013

Related U.S. Application Data

(62) Division of application No. 12/784,620, filed on May 21, 2010, now Pat. No. 8,288,796.

(30) Foreign Application Priority Data

Jun. 11, 2009   (JP) .................................. 2009-140271

(51) Int. Cl.
  *H01L 31/0328*  (2006.01)
  *H01L 31/0336*  (2006.01)
  *H01L 31/072*   (2012.01)
  *H01L 31/109*   (2006.01)

(52) U.S. Cl.
  USPC .................... 257/192; 257/194; 257/E29.246

(58) Field of Classification Search
  USPC .......................................... 257/192, E29.246
  See application file for complete search history.

(56) References Cited

U.S. PATENT DOCUMENTS

2005/0173728 A1    8/2005  Saxler

FOREIGN PATENT DOCUMENTS

JP           10-173203 A     6/1998

*Primary Examiner* — Thien F Tran
(74) *Attorney, Agent, or Firm* — Birch, Stewart, Kolasch & Birch, LLP

(57) ABSTRACT

One embodiment of a semiconductor device according to the present invention includes a substrate, a base compound semiconductor layer layered on the substrate to form a base, a channel defining compound semiconductor layer layered on the base compound semiconductor layer to define a channel, and an impact ionization control layer that is layered within a layering range of the base compound semiconductor layer and controls the location of impact ionization, wherein the base compound semiconductor layer is formed of a first compound semiconductor, the channel defining compound semiconductor layer is formed of a second compound semiconductor, and the impact ionization control layer is formed of a third compound semiconductor that has a smaller band gap than the first compound semiconductor.

4 Claims, 12 Drawing Sheets

SEMICONDUCTOR DEVICE

CROSS-REFERENCE TO RELATED APPLICATIONS

This application is a Divisional of application Ser. No. 12/784,620 filed on May 21, 2010 now U.S. Pat. No. 8,288,796, which claims priority to Application No. 2009-140271 filed in Japan, on Jun. 11, 2009. The entire contents of all of the above applications is hereby incorporated by reference.

BACKGROUND OF THE INVENTION

1. Field of the Invention

The present invention relates to a semiconductor device that includes an impact ionization control layer that controls the location of impact ionization.

2. Related Art

Semiconductor devices (nitride semiconductor devices) using nitride semiconductors have large dielectric breakdown electric fields, excellent heat resistance, and high electron saturation drift velocity, so that they can provide electronic devices that are excellent in terms of high-temperature or high-power operation, for example, as compared to Si- or GaAs-based devices. For this reason, the development of semiconductor devices using nitride semiconductors is being pursued.

For example, for the manufacture of a semiconductor device (specifically, a field-effect transistor: FET) that is one kind of electronic device, it is necessary to use an electrode that has Schottky characteristics on compound semiconductors (nitride semiconductors) as a gate electrode.

If an electrode having Schottky characteristics is directly joined to a nitride semiconductor, a Schottky leakage current may be generated and may adversely affect the transistor characteristics. Because of this background, the research and development of field-effect transistors having an MIS (metal-insulator semiconductor) structure (hereinafter referred to as "MISFETs") are being pursued in order to reduce the Schottky leakage current (e.g., JP H10-173203A).

However, in some cases, conventional MISFETs may induce impact ionization (a phenomenon in which electrons accelerated by an electric field collide with the crystal lattice, thereby producing electrons and holes) in a channel that corresponds to the gate electrode.

The holes caused by such impact ionization are hard to absorb with the gate electrode because of the presence of a gate insulating film. Also for the drain electrode and the source electrode, it is difficult to speedily absorb the holes because of their distances from the location of the impact ionization. In other words, the holes are accumulated in the channel that corresponds to the gate electrode, which causes the problem that the current flowing through the channel is affected by the holes, thus inhibiting proper operation.

SUMMARY OF THE INVENTION

The present invention has been achieved in view of the above conventional problems, and an object thereof is to provide a semiconductor device that is capable of controlling the location of impact ionization with ease and high precision and efficiently absorbing generated electrons and holes, thereby achieving proper operating characteristics and high reliability. In other words, an object of the present invention is to solve the problems resulting from unstable operations of conventional semiconductor devices due to holes caused by impact ionization that occurs in a channel that corresponds to the gate electrode.

The semiconductor device according to the present invention is a semiconductor device including a substrate, a base compound semiconductor layer that is layered on the substrate to form a base, a channel defining compound semiconductor layer that is layered on the base compound semiconductor layer to define a channel, and an impact ionization control layer that is layered within a layering range of the base compound semiconductor layer and controls a location of impact ionization, wherein the base compound semiconductor layer is formed of a first compound semiconductor, the channel defining compound semiconductor layer is formed of a second compound semiconductor, and the impact ionization control layer is formed of a third compound semiconductor that has a smaller bang gap than the first compound semiconductor.

With this configuration, the semiconductor device according to the present invention is capable of controlling the location of impact ionization with ease and high precision and efficiently absorbing generated electrons and holes, thus reducing the influence of impact ionization and achieving proper operating characteristics and high reliability.

Preferably, in the semiconductor device according to the present invention, a plurality of the impact ionization control layer may be formed within the layering range of the base compound semiconductor layer.

With this configuration, the semiconductor device according to the present invention is capable of controlling an impact ionization control layer with higher precision, thus allowing easy and high-precision control over the occurrence of impact ionization.

Preferably, the semiconductor device according to the present invention may include a gate insulating film formed on the part of the channel defining compound semiconductor layer, a gate electrode formed on the gate insulating film, a source electrode arranged on one side of the gate electrode, and a drain electrode arranged on the other side of the gate electrode, facing the source electrode.

With this configuration, the semiconductor device according to the present invention is capable of, when it operates as a horizontal field-effect transistor, controlling the location of impact ionization and allowing impact ionization to occur in the vicinity of the drain region before impact ionization occurs in a channel that corresponds to the gate electrode. Accordingly, the semiconductor device is capable of absorbing electrons and holes generated in the vicinity of the drain region into the drain and the source, thus preventing the accumulation of holes in a channel due to impact ionization and achieving proper operating characteristics.

Preferably, in the semiconductor device according to the present invention, the impact ionization control layer may be arranged closer to the channel defining compound semiconductor layer side than a middle of the layering range of the base compound semiconductor layer.

With this configuration, for example when operating as a field-effect transistor, the semiconductor device according to the present invention suppresses a reduction in the electric field strength in the base compound semiconductor layer arranged on the channel defining compound semiconductor layer side and ensures the generation of impact ionization in the vicinity of the drain region, thus achieving proper operating characteristics with ease.

Preferably, the semiconductor device according to the present invention may include a buffer layer that is arranged between the substrate and the base compound semiconductor layer and provides crystal lattice matching, wherein, if the substrate is a non-isolating substrate, a thickness of the layering range of the base compound semiconductor layer is at least half a thickness of the buffer layer.

With this configuration, the semiconductor device according to the present invention secures the required film thickness for the base compound semiconductor layer, thus making it possible to reduce the influence of an electric field from the substrate (non-isolating substrate) through the buffer layer on the base compound semiconductor layer and to thereby control the occurrence of impact ionization with reliability.

Preferably, in the semiconductor device according to the present invention, the first compound semiconductor, the second compound semiconductor, and the third compound semiconductor may be nitride semiconductors.

With this configuration, the semiconductor device according to the present invention is capable of reflecting excellent characteristics of nitride semiconductors (high-frequency characteristics, high-power characteristics, high-breakdown voltage characteristics, and high-temperature characteristics), thus achieving excellent characteristics (high-frequency characteristics, high-power characteristics, high-breakdown voltage characteristics, and high-temperature characteristics).

Preferably, in the semiconductor device according to the present invention, the first compound semiconductor may be AlGaN, and the third compound semiconductor may be any one of InGaN, GaN, and AlGaN that has a lower Al mixed crystal ratio than the AlGaN of the first compound semiconductor.

With this configuration, the semiconductor device according to the present invention is capable of forming the base compound semiconductor layer and the impact ionization control layer with ease and high precision.

Preferably, in the semiconductor device according to the present invention, the first compound semiconductor may be GaN, and the third compound semiconductor may be InGaN.

With this configuration, the semiconductor device according to the present invention is capable of forming the base compound semiconductor layer and the impact ionization control layer with ease and high precision.

Preferably, in the semiconductor device according to the present invention, the channel defining compound semiconductor layer may include a channel layer where a two-dimensional electron gas layer is formed, and a barrier layer that is layered on the channel layer and provides a barrier against the two-dimensional electron gas layer.

With this configuration, the semiconductor device according to the present invention is capable of easily forming a highly concentrated two-dimensional electron gas layer and accordingly operating at high frequency and high power.

Preferably, in the semiconductor device according to the present invention, the channel layer may be a GaN layer that is laminated on the base compound semiconductor layer, and the barrier layer may be an AlGaN layer.

With this configuration, the semiconductor device according to the present invention is capable of easily forming the two-dimensional electron gas layer as a channel in the GaN layer included in the channel defining compound semiconductor layer.

Preferably, in the semiconductor device according to the present invention, the channel defining compound semiconductor layer may be a barrier layer that provides a barrier against a two-dimensional electron gas layer formed in the base compound semiconductor layer.

With this configuration, the semiconductor device according to the present invention is capable of easily forming a highly concentrated two-dimensional electron gas layer and accordingly operating at high frequency and high power.

Preferably, in the semiconductor device according to the present invention, the base compound semiconductor layer may be formed of AlGaN, and the barrier layer may be formed of AlGaN that has a higher Al mixed crystal ratio than the AlGaN of the base compound semiconductor layer.

With this configuration, the semiconductor device according to the present invention is capable of easily forming the two-dimensional electron gas layer as a channel in the AlGaN layer constituting the base compound semiconductor layer.

Preferably, in the semiconductor device according to the present invention, the base compound semiconductor layer may be formed of GaN, and the barrier layer may be formed of AlGaN.

With this configuration, the semiconductor device according to the present invention is capable of easily forming the two-dimensional electron gas layer as a channel in the GaN layer constituting the base compound semiconductor layer.

Preferably, in the semiconductor device according to the present invention, a distance between the impact ionization control layer and the two-dimensional electron gas layer may be in the range of 0.2 µm to 1.0 µm.

With this configuration, the semiconductor device according to the present invention is capable of reducing the generation of a leakage current caused by an impact ionization control layer and effectively absorbing electrons and holes generated due to impact ionization, thus achieving stable operating characteristics.

Preferably, the semiconductor device according to the present invention may include a recessed portion constituted by a groove that extends from a surface to the two-dimensional electron gas layer.

With this configuration, the semiconductor device according to the present invention provides a high-precisely controlled and normally-off field-effect transistor.

DESCRIPTION OF THE PREFERRED EMBODIMENTS

Hereinafter, embodiments of the present invention will be described with reference to the drawings.

First Embodiment

A semiconductor device and a manufacturing method therefor according to the present embodiment will be described with reference to FIGS. 1 to 10.

Figure 1:
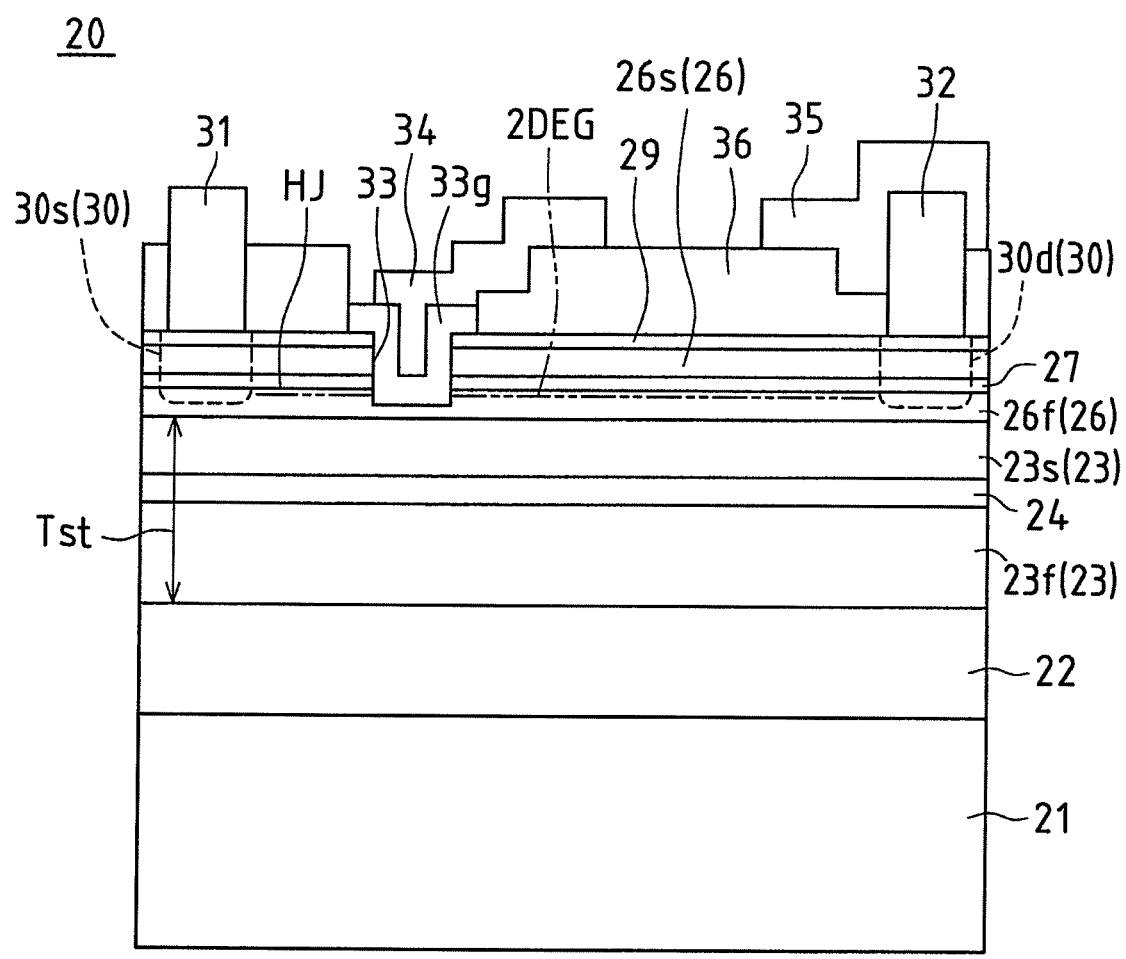
FIG. 1 is a diagrammatic cross-sectional view diagrammatically illustrating the general configuration of a semiconductor device according to a first embodiment of the present invention.

FIG. 1 is a diagrammatic cross-sectional view diagrammatically illustrating the general configuration of a semiconductor device according to a first embodiment of the present invention. Note that any hatching indicating the cross-sectional plane is omitted for the visibility of the drawing (the same applies to the following drawings).

One example of a semiconductor device 20 according to the present embodiment is a field-effect transistor (MOSFET) having a compound semiconductor MOS structure.

The semiconductor device 20 includes multiple layers layered in sequence on a substrate 21, namely a buffer layer 22, a base compound semiconductor layer 23f (base compound semiconductor layer 23), an impact ionization control layer 24, a base compound semiconductor layer 23s (base compound semiconductor layer 23), a channel defining compound semiconductor layer 26f (channel defining compound semiconductor layer 26), an intermediate layer 27, a channel defining compound semiconductor layer 26s (channel defining compound semiconductor layer 26), and a cap layer 29.

In the following description, if no distinction is required between the base compound semiconductor layer 23f and the base compound semiconductor layer 23s, they may be simply referred to as the "base compound semiconductor layer 23". Also, the channel defining compound semiconductor layer 26f and the channel defining compound semiconductor layer 26s may be collectively described as the "channel defining compound semiconductor layer 26".

In the channel defining compound semiconductor layer 26f, a two-dimensional electron gas layer 2DEG is formed by the action of spontaneous polarization and piezopolarization of the channel defining compound semiconductor layer 26s. Specifically, the channel defining compound semiconductor layer 26f serves as a channel layer (channel), whereas the channel defining compound semiconductor layer 26s serves as a barrier layer against the two-dimensional electron gas layer 2DEG.

The intermediate layer 27 formed between the channel defining compound semiconductor layer 26f and the channel defining compound semiconductor layer 26s lessens the influence of alloy scattering on the two-dimensional electron gas layer 2DEG, caused by the channel defining compound semiconductor layer 26s.

The substrate 21 is a highly concentrated p-type Si substrate having a (111) crystal plane orientation, the buffer layer 22 is a GaN/AlN (gallium nitride/aluminum nitride) superlattice buffer layer having a film thickness of 2.8 µm, the base compound semiconductor layer 23f is an $Al_{0.05}Ga_{0.95}N$ (aluminum gallium nitride: AlGaN) layer having a film thickness of 1.95 µm, the impact ionization control layer 24 is an $In_{0.1}Ga_{0.9}N$ (indium gallium nitride) layer having a film thickness of 50 nm, the base compound semiconductor layer 23s is an $Al_{0.05}Ga_{0.95}N$ layer having a film thickness of 425 nm, the channel defining compound semiconductor layer 26f is a GaN layer having a film thickness of 50 nm, the intermediate layer 27 is an AlN layer having a film thickness of 1 nm, the channel defining compound semiconductor layer 26s is an $Al_{0.25}Ga_{0.75}N$ (AlGaN) layer having a film thickness of 23 nm, and the cap layer 29 is a GaN layer having a film thickness of 1 nm.

That is, the semiconductor device 20 according to the present embodiment includes the substrate 21, the base compound semiconductor layer 23 (the base compound semiconductor layer 23f and the base compound semiconductor layer 23s) that is layered on the substrate 21 to form a base, and the channel defining compound semiconductor layer 26 (the channel defining compound semiconductor layer 26f and the channel defining compound semiconductor layer 26s) that is layered on the base compound semiconductor layer 23 to define a channel. Note that the intermediate layer 27 is not included in the channel defining compound semiconductor layer 26 because it contributes little to the formation itself of the two-dimensional electron gas layer 2DEG.

The semiconductor device 20 further includes the impact ionization control layer 24 that is layered within a layering range (a thickness Tst of the layering range) of the base compound semiconductor layer 23 and controls the location of impact ionization. The base compound semiconductor layer 23 is formed of a first compound semiconductor (AlGaN such as $Al_{0.05}Ga_{0.95}N$), the channel defining compound semiconductor layer 26 is formed of a second compound semiconductor (GaN or AlGaN such as $Al_{0.25}Ga_{0.75}N$), and the impact ionization control layer 24 is formed of a third compound semiconductor (InGaN such as $In_{0.1}Ga_{0.9}N$) that has a smaller band gap than the first compound semiconductor.

The semiconductor device 20 is thus capable of controlling the location of impact ionization with ease and high precision and efficiently absorbing generated electrons and holes. Specifically, the holes generated in the vicinity of a drain electrode 32 due to impact ionization move toward a source electrode 31 along the interface between the buffer layer 22 and the base compound semiconductor layer 23f, and are absorbed into the source electrode 31. Meanwhile, the electrons generated due to impact ionization are absorbed into the drain electrode 32.

In other words, it is possible to reduce the influence of electrons and holes generated due to impact ionization on carrier signals and to thereby achieve proper operating characteristics and high reliability. Note that the function of the impact ionization control layer 24 can be checked by simulation, and such a simulation result will be described in detail with reference to FIGS. 9 and 10.

Note that, in the case where the spontaneous polarization of the impact ionization control layer 24 is large, a large electric field is caused by the spontaneous polarization, so that impact ionization is likely to occur and a large leakage current is generated by parallel conduction. On the other hand, in the case where the spontaneous polarization of the impact ionization control layer 24 is small, impact ionization is less likely to occur than with an impact ionization control layer that has a large spontaneous polarization, so that the leakage current due to parallel conduction is reduced. It is thus desirable that the spontaneous polarization of the impact ionization control layer 24 be as small as possible in order to stabilize the operating characteristics.

In the channel defining compound semiconductor layer 26f, the intermediate layer 27, the channel defining compound semiconductor layer 26s, and the cap layer 29, an ion implantation region 30 is formed either as a source region 30s or a drain region 30d by ion implantation from the surface. The ion implantation region 30 has a high concentration of n-type impurities introduced therein. In the following description, if no distinction is required between the source region 30s and the drain region 30d, they may be simply referred to as the "ion implantation region 30".

In the cap layer 29, the source electrode 31 is formed joined (by ohmic contact) to the source region 30s and the drain electrode 32 is formed joined (by ohmic contact) to the drain region 30d. The drain electrode 32 is further connected to a drain field electrode 35 so as to reduce the electric field strength in the drain region 30d.

A recessed portion 33 is formed in the shape of a groove between the source region 30s and the drain region 30d, a gate insulating film 33g is formed on the surface (bottom and side faces) of the recessed portion 33, and a gate electrode 34 is overlaid on the gate insulating film 33g. The gate insulating film 33g is formed of $SiO_2$ so as to create a MOS type. That is, the semiconductor device 20 is a horizontal MOS (metal-oxide-semiconductor) field-effect transistor (MOSFET).

Note that the semiconductor device 20 may be an MIS (metal-insulator semiconductor) field-effect transistor (MISFET) in which the gate insulating film is composed of a material other than an oxide film. As another alternative, the insulating film may also have another structure. Various forms are applicable, such as the case where multiple insulating films are layered one above another or the case where a high-dielectric insulating film is adopted.

A surface protective film 36 that covers and protects the cap layer 29 (the semiconductor device 20) is formed between the source electrode 31, the drain electrode 32, and the gate electrode 34.

Examples of materials applicable as the substrate 21 include, in addition to Si, crystalline metal oxides (such as $Al_2O_3$, ZnO, or MgO), a single crystal of a group IV two-dimensional mixed crystal (such as SiC), a single crystal of a group III-V compound (such as GaAs or InAs), a single crystal of a group II-VI compound (such as ZnSe), and glass (such as silica glass or MESA glass). Examples of materials applicable as the buffer layer 22 include amorphous substances (such as AlN, GaN, Si, and SiC) and single-crystal substances (such as AlN, ZnO, and SiC).

As described above, the semiconductor device 20 includes the gate insulating film 33g formed on the part of the channel defining compound semiconductor layer 26 (the channel defining compound semiconductor layer 26f and the channel defining compound semiconductor layer 26s), the gate electrode 34 formed on the gate insulating film 33g, the source electrode 31 arranged on one side of the gate electrode 34, and the drain electrode 32 arranged on the other side of the gate electrode 34, facing to the source electrode 31.

With this configuration, the semiconductor device 20 (the field-effect transistor) is capable of controlling the location of impact ionization in the horizontal field-effect transistor and causing impact ionization to occur in the vicinity of the drain region before impact ionization occurs in a channel corresponding to the gate electrode 34. This allows the semiconductor device 20 to absorb electrons and holes generated in the vicinity of the drain region into the drain and the source, thus preventing the accumulation of holes in a channel due to impact ionization and thereby achieving proper operating characteristics.

If the film thickness of the base compound semiconductor layer 23s is greater than the film thickness of the base compound semiconductor layer 23f, impact ionization is less likely to occur in the vicinity of the drain region 30d because the electric field spreads in the base compound semiconductor layer 23s and the electric field strength decreases.

It is thus desirable that the impact ionization control layer 24 be arranged closer to the channel defining compound semiconductor layer 26f (channel defining compound semiconductor layer 26) than the middle between the base compound semiconductor layer 23f and the base compound semiconductor layer 23s.

In the present embodiment, the configuration is designed such that the base compound semiconductor layer 23f has a film thickness of 1.95 μm, the base compound semiconductor layer 23s has a film thickness of 425 nm, and the impact ionization control layer 24 has a film thickness of 50 nm and is sandwiched between the base compound semiconductor layer 23f and the base compound semiconductor layer 23s.

That is, it is desirable that the impact ionization control layer 24 be arranged closer to the channel defining compound semiconductor layer 26f than the middle (a position about 1.2 μm away from the ends of the layering range) of the layering range (the thickness Tst of the layering range=1.95 μm+425 nm+50 nm=2.425 μm) of the base compound semiconductor layer 23.

This configuration suppresses a reduction in the electric field strength in the base compound semiconductor layer 23s arranged on the channel defining compound semiconductor layer 26f side and allows impact ionization to occur with reliability in the vicinity of, for example, the drain region 30d of the field-effect transistor (see FIG. 9), thus easily achieving a semiconductor device 20 having proper operating characteristics.

The base compound semiconductor layer 23f and the base compound semiconductor layer 23s are formed so that their total film thickness (2.375 μm) will be the thickness required to provide the required electric field strength. If the thickness of the base compound semiconductor layer 23 is insufficient for the required thickness, the holes generated due to impact ionization collide with the gate insulating film 33g and fail to reach the source region 30s, which makes it difficult to effect the function of the impact ionization control layer 24.

Moreover, in the case where the substrate 21 is a non-isolating substrate (e.g., a Si substrate), the electric field in the base compound semiconductor layer 23 varies under the influence of the electric field from the substrate 21. That is, in order to stabilize the function of the impact ionization control layer 24, it is necessary to reduce the influence of the electric field from the substrate 21 on the base compound semiconductor layer 23.

It is thus desirable that the total film thickness of the base compound semiconductor layer 23f and the base compound semiconductor layer 23s be made greater than half the film thickness of the buffer layer 22 so as to secure the required thickness of the base compound semiconductor layer 23 for securing the electric field strength and to reduce the influence of the electric field from the substrate 21 on the base compound semiconductor layer 23 in order to stabilize the electric field in the base compound semiconductor layer 23.

The semiconductor device 20 includes the buffer layer 22 that is arranged between the substrate 21 and the base compound semiconductor layer 23 so as to provide crystal lattice matching. In the case where the substrate 21 is a non-isolating substrate, the thickness Tst (2.425 μm) of the layering range of the base compound semiconductor layer 23 is made greater than half the thickness (2.8 μm/2=1.4 μm) of the buffer layer 22.

This configuration secures the required film thickness for the base compound semiconductor layer 23, thus reducing the influence of the electric field from the substrate 21 (the non-isolating substrate) through the buffer layer 22 on the base compound semiconductor layer 23 and accordingly allowing reliable control over the occurrence of impact ionization.

In the semiconductor device 20, the first compound semiconductor (base compound semiconductor layer 23) is AlGaN (e.g., $Al_{0.05}Ga_{0.95}N$). Thus, the third compound semiconductor that has a smaller band gap than AlGaN ($Al_{0.05}Ga_{0.95}N$) (such as InGaN, GaN (see the third embodiment), or AlGaN that has a lower Al mixed crystal ratio than the AlGaN of the first compound semiconductor (see the fourth embodiment)) can be adopted as the impact ionization control layer 24.

That is, in the semiconductor device 20, the first compound semiconductor (the base compound semiconductor layer 23f and the base compound semiconductor layer 23s) is AlGaN, and the third compound semiconductor constituting the impact ionization control layer 24 is any one of InGaN, GaN, and AlGaN that has a lower Al mixed crystal ratio than the AlGaN of the first compound semiconductor. This configuration allows the base compound semiconductor layer 23 and the impact ionization control layer 24 to be formed with ease and high precision.

Note that the Al mixed crystal ratio and the value of the band gap correlate in AlGaN, so that in the case of adopting AlGaN, the Al mixed crystal ratio can be selected so as to satisfy the conditions required for the value of band gap.

The channel defining compound semiconductor layer 26f forms a heterojunction HJ with the intermediate layer 27 (and the channel defining compound semiconductor layer 26s) layered thereon. In other words, the channel defining compound semiconductor layer 26 includes a channel layer (the channel defining compound semiconductor layer 26f) where the two-dimensional electron gas layer 2DEG is formed, and a barrier layer (the channel defining compound semiconductor layer 26s) that is layered on the channel layer (the channel defining compound semiconductor layer 26f) and provides a barrier against the two-dimensional electron gas layer 2DEG. This configuration allows easy formation of the highly concentrated two-dimensional electron gas layer 2DEG, thus achieving a semiconductor device 20 that is capable of operating at high frequency and high power.

As described above, the intermediate layer 27 and the channel defining compound semiconductor layer 26s form the heterojunction HJ with the channel defining compound semiconductor layer 26f. The channel defining compound semiconductor layer 26f is formed of GaN, the intermediate layer 27 is formed of AlN, and the channel defining compound semiconductor layer 26s is formed of AlGaN. The band gap of GaN (the channel defining compound semiconductor layer 26f serving as the channel layer) is smaller than the band gaps of AlN (the intermediate layer 27) and AlGaN (the channel defining compound semiconductor layer 26s serving as the barrier layer). Accordingly, the channel defining compound semiconductor layer 26s (AlGaN layer) serves as a barrier layer that provides a barrier against the two-dimensional electron gas layer 2DEG formed in the channel defining compound semiconductor layer 26f.

Note that the two-dimensional electron gas layer 2DEG is formed in the channel defining compound semiconductor layer 26f closer to the boundary with the intermediate layer 27. In other words, the two-dimensional electron gas layer 2DEG as a channel can be easily formed in the GaN layer constituting the channel defining compound semiconductor layer 26f (the channel layer).

The layering of the channel defining compound semiconductor layer 26s (the barrier layer) on the intermediate layer 27 that forms the heterojunction HJ with the channel defining compound semiconductor layer 26f allows an electric field to be generated based on spontaneous polarization and piezopolarization, so that the two-dimensional electron gas layer 2DEG can be formed in the channel defining compound semiconductor layer 26f closer to the boundary with the intermediate layer 27 (the channel defining compound semiconductor layer 26s). Also, the layering of the cap layer 29 allows control over the surface condition.

Note that the distance between the impact ionization control layer 24 and the heterojunction HJ (the two-dimensional electron gas layer 2DEG) is desirably in the range of 0.2 μm to 1.0 μm. This configuration reduces the generation of a leakage current caused by the impact ionization control layer 24 and accordingly allows effective absorption of electrons and holes generated due to impact ionization, thus providing the semiconductor device 20 with stable operating characteristics.

In the case where the distance between the impact ionization control layer 24 and the two-dimensional electron gas layer 2DEG is smaller than 0.2 μm, there is a risk that the impact ionization control layer 24 and the drain region 30d (the drain electrode 32) may be in too close proximity to each other and thus the impact ionization control layer 24 may become a source of current leakage. In the case where the distance between the impact ionization control layer 24 and the two-dimensional electron gas layer 2DEG is larger than 1.0 μm, there is a risk that the impact ionization control layer 24 and the drain region 30d (the drain electrode 32) may be too far away from each other and thus the impact ionization control layer 24 may not function well.

The semiconductor device 20 includes the recessed portion 33 that is constituted by a groove that extends from the surface to the two-dimensional electron gas layer 2DEG. In a situation where no voltage is applied to the gate electrode 34, the two-dimensional electron gas layer 2DEG is cut off by the recessed portion 33 and the semiconductor device 20 remains in its off state. Thus, a normally-off field-effect transistor that is capable of being controlled with high precision (the semiconductor device 20) is provided. Note that an ON operation is effected by applying a positive voltage to the gate insulating film 33g and producing an inversion channel in the channel defining compound semiconductor layer 26f serving as the channel (channel layer).

As described above, in the semiconductor device 20 according to the present embodiment, the first compound semiconductor, the second compound semiconductor, and the third compound semiconductor are desirably nitride semiconductors. This configuration allows excellent characteristics of the nitride semiconductors (high-frequency characteristics, high-power characteristics, high-breakdown voltage characteristics, and high-temperature characteristics) to be reflected, thereby providing the semiconductor device with excellent characteristics (high-frequency characteristics, high-power characteristics, high-breakdown voltage characteristics, and high-temperature characteristics). Note that the first compound semiconductor, the second compound semiconductor, and the third compound semiconductor are not limited to nitride semiconductors, and it is possible to adopt compound semiconductors other than nitride semiconductors.

A method (manufacturing steps) for manufacturing the semiconductor device 20 according to the present embodiment will be described with reference to FIGS. 2 to 8.

Figure 2:
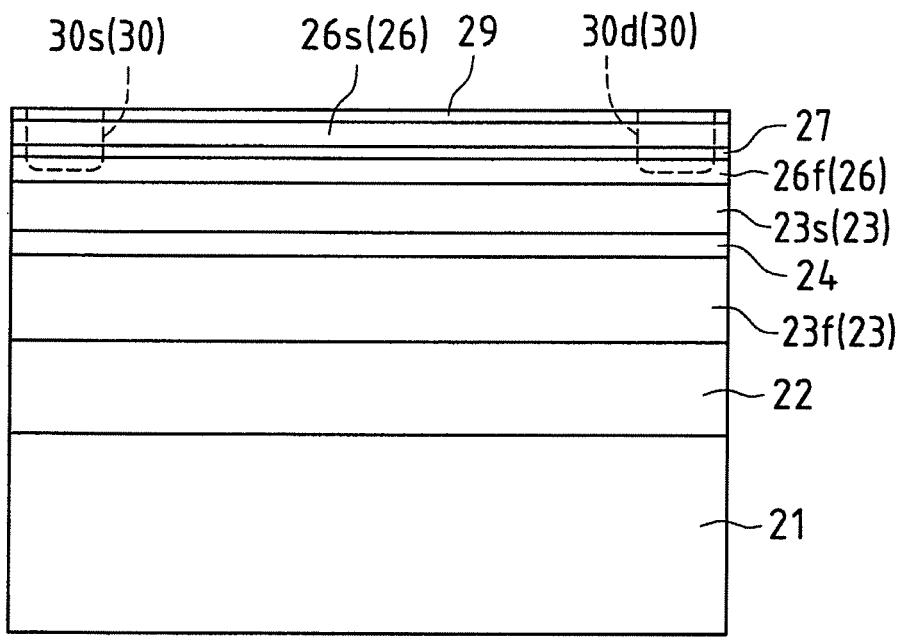
FIG. 2 is a diagrammatic cross-sectional view diagrammatically illustrating a state in the step of laminating a compound semiconductor layer on a substrate of the semiconductor device illustrated in FIG. 1 and forming an ion implantation region.

FIG. 2 is a diagrammatic cross-sectional view diagrammatically illustrating a state in the step of laminating compound semiconductor layers on a substrate of the semiconductor device illustrated in FIG. 1 and forming an ion implantation region.

The buffer layer 22, the base compound semiconductor layer 23f (base compound semiconductor layer 23), the impact ionization control layer 24, the base compound semiconductor layer 23s (base compound semiconductor layer 23), the channel defining compound semiconductor layer 26f, the intermediate layer 27, the channel defining compound semiconductor layer 26s, and the cap layer 29 are layered on the substrate 21.

Note that those layers may be formed using a method such as molecular beam epitaxy (MBE) or metal organic chemical vapor deposition (MOCVD).

On the cap layer 29, SiNx (silicon nitride) having a film thickness of 25 nm, for example, is deposited as an ion implantation protective film, and a resist is further applied thereon. The applied resist is subjected to patterning so as to form openings that correspond to the source region 30s and the drain region 30d. Using the patterned resist as a mask, a silicon isotope $^{28}$Si is ion-implanted at an energy of 50 keV and a dose of $1\times10^{14}/cm^2$ to $1\times10^{16}/cm^2$.

After the resist and the ion implantation protective film has been stripped, SiNx having a film thickness of 50 nm, for example, is deposited as an activation protective film and subjected to activation annealing at 1100 to 1300° C. so as to form the activated ion implantation region 30 (the source region 30s and the drain region 30d). Note that examples of targets to be implanted into the ion implantation region 30 include, in addition to the silicon isotope $^{28}$Si, n-type dopants such as silicon isotopes $^{29}$Si and $^{30}$Si and oxygen isotopes $^{16}$O, $^{17}$O, and $^{18}$O.

Figure 3:
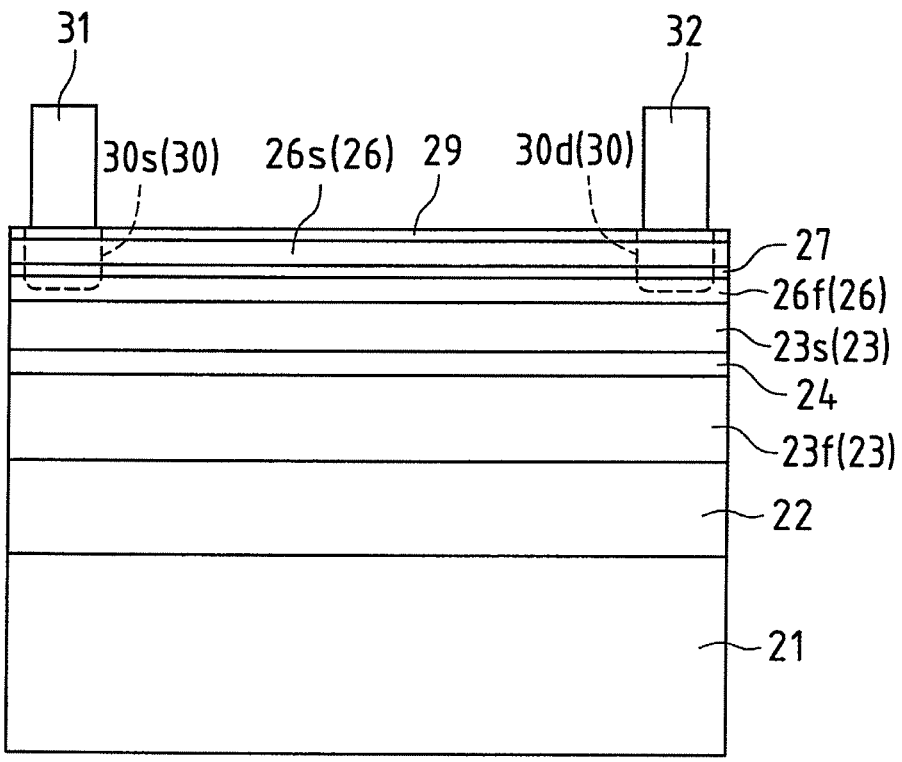
FIG. 3 is a diagrammatic cross-sectional view diagrammatically illustrating a state in the step of forming a source electrode and a drain electrode after the step illustrated in FIG. 2.

FIG. 3 is a diagrammatic cross-sectional view diagrammatically illustrating a state in the step of forming a source electrode and a drain electrode after the step illustrated in FIG. 2.

On the surface of the cap layer 29, Ti (titanium) having a film thickness of 30 nm, Al (aluminum) having a film thickness of 100 nm, and Au (gold) having a film thickness of 200 nm are evaporated in sequence. The evaporated Ti, Al, and Au are patterned by a lift-off method or etching so as to form the source electrode 31 and the drain electrode 32. Thereafter, annealing is performed in a nitrogen atmosphere at 500° C. to 900° C. so as to obtain excellent Ohmic features.

Figure 4:
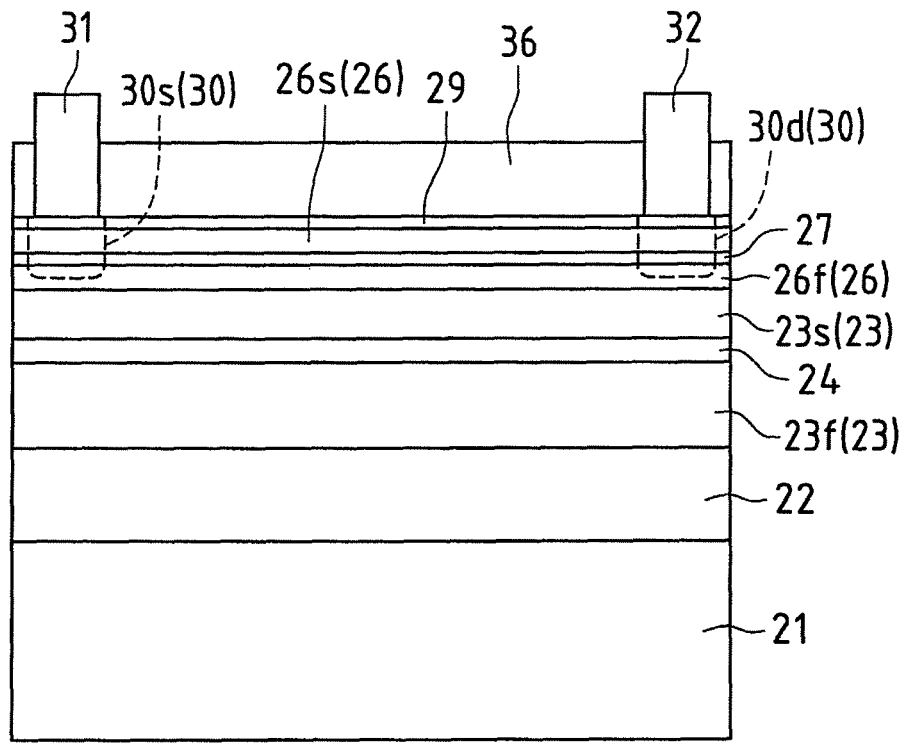
FIG. 4 is a diagrammatic cross-sectional view diagrammatically illustrating a state in the step of forming a surface protective film between the source electrode and the drain electrode after the step illustrated in FIG. 3.

FIG. 4 is a diagrammatic cross-sectional view diagrammatically illustrating a state in the step of forming a surface protective film between the source electrode and the drain electrode after the step illustrated in FIG. 3.

After the source electrode 31 and the drain electrode 32 have been formed, SiNx is deposited by plasma CVD (chemical vapor deposition) to a film thickness of 300 nm on the surface of the cap layer 29 (the surface of the compound semiconductor layer) between the source electrode 31 and the drain electrode 32, so as to form the surface protective film 36 having a refractive index of 2.0, for example.

Figure 5:
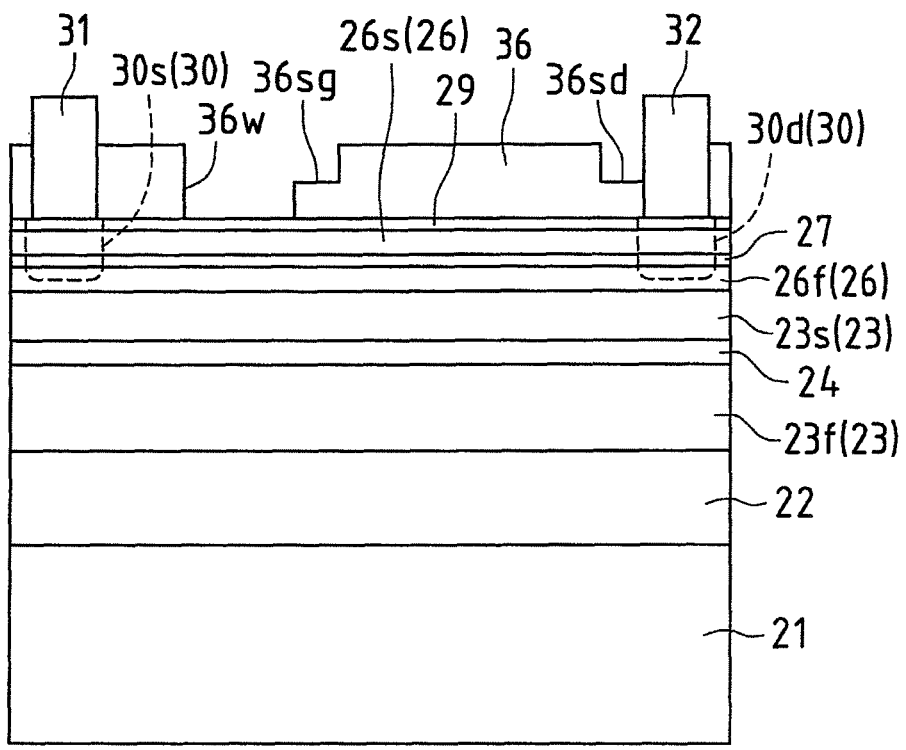
FIG. 5 is a diagrammatic cross-sectional view diagrammatically illustrating a state in the step of processing the surface protective film into a step-like shape after the step illustrated in FIG. 4.

FIG. 5 is a diagrammatic cross-sectional view diagrammatically illustrating a state in the step of processing a surface protective film into a step-like shape after the step illustrated in FIG. 4.

The surface protective film 36 is patterned so as to form a surface opening portion 36w corresponding to a region where the recessed portion 33 (see FIG. 6) will be formed. Also, a stepped portion 36sg is formed on the drain side of the surface opening portion 36w, and a stepped portion 36sd is formed on the gate side of the drain electrode 32. The stepped portions 36sg and 36sd are formed by etching the surface protective film 36 to approximately 0.5 μm to 2 μm in the lateral direction and to approximately 150 nm in the direction of layering.

Figure 6:
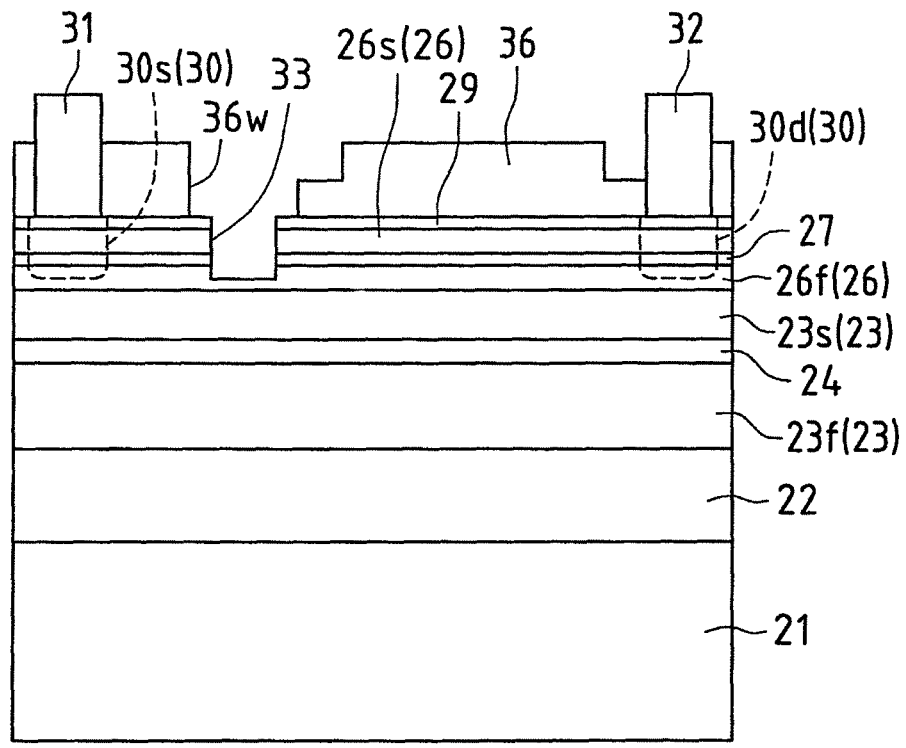
FIG. 6 is a diagrammatic cross-sectional view diagrammatically illustrating a state in the step of forming a recessed portion after the step illustrated in FIG. 5.

FIG. 6 is a diagrammatic cross-sectional view diagrammatically illustrating a state in the step of forming a recessed portion after the step illustrated in FIG. 5.

The compound semiconductor layer in a central part of the surface opening portion 36w is removed by dry etching so as to form the recessed portion 33 in the shape of a groove that has a depth of 50 nm from the surface. Specifically, a groove is formed that extends through the cap layer 29 having a film thickness of 1 nm, the channel defining compound semiconductor layer 26s having a film thickness of 23 nm, and the intermediate layer 27 having a film thickness of 1 nm to the middle portion of the channel defining compound semiconductor layer 26f.

Figure 7:
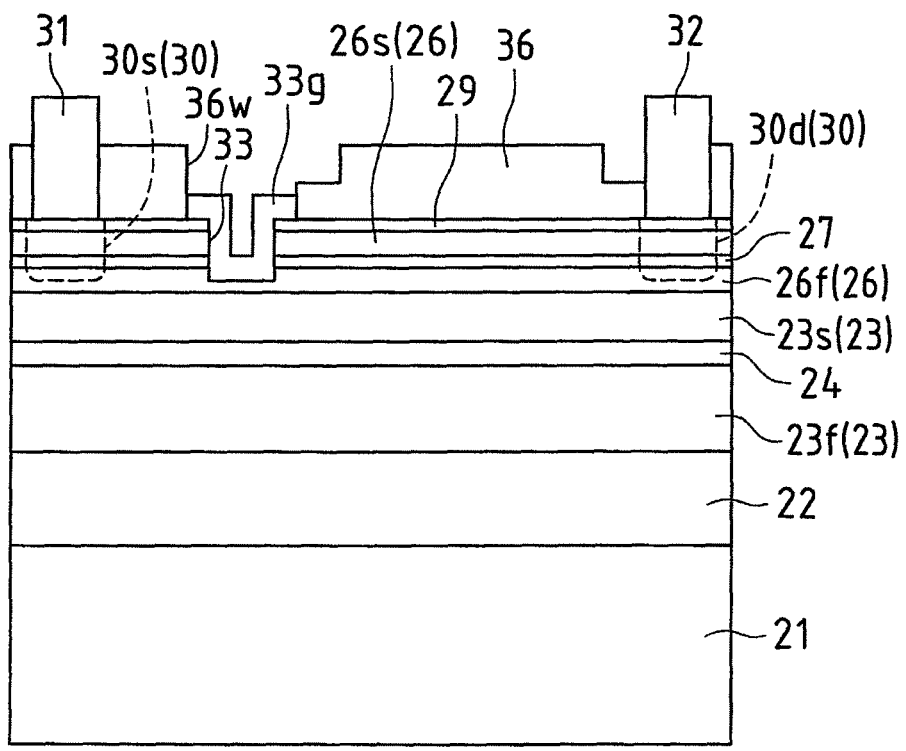
FIG. 7 is a diagrammatic cross-sectional view diagrammatically illustrating a state in the step of forming an oxide film on the recessed portion after the step illustrated in FIG. 6.

FIG. 7 is a diagrammatic cross-sectional view diagrammatically illustrating a state in the step of forming an oxide film on the recessed portion after the step illustrated in FIG. 6.

A gate insulating film 33g is formed so as to cover the surface (bottom and side faces) of the recessed portion 33 and the bottom face of the surface opening portion 36w. The gate insulating film 33g is formed by depositing $SiO_2$ by sputtering to a film thickness of 25 nm and then patterning as appropriate.

Figure 8:
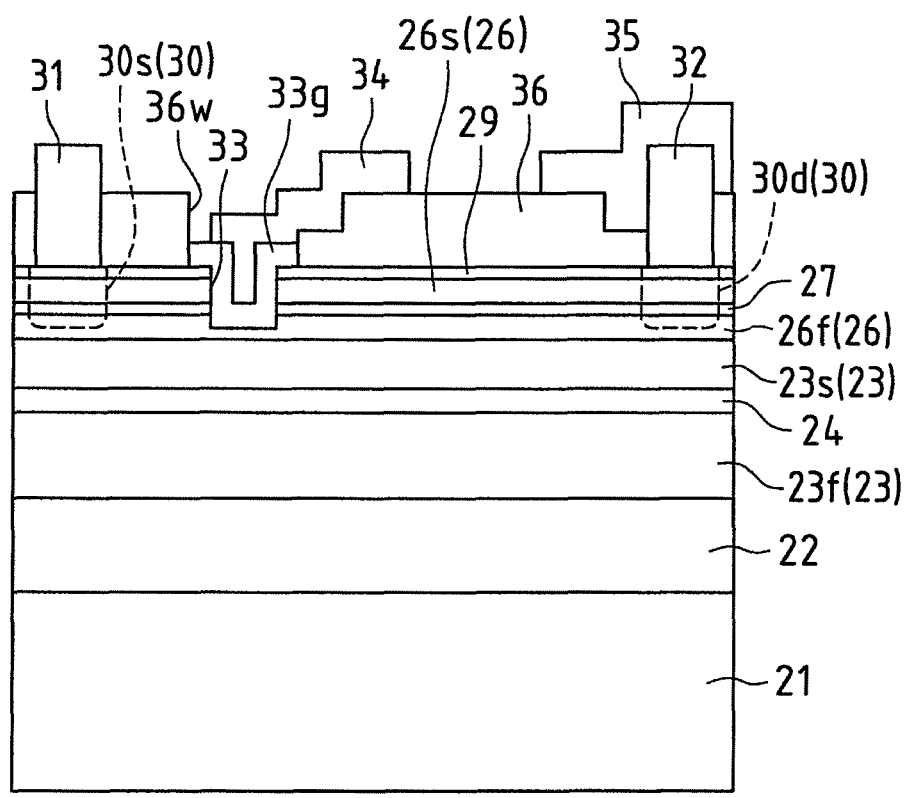
FIG. 8 is a diagrammatic cross-sectional view diagrammatically illustrating a state in the step of forming a gate electrode and a drain field electrode after the step illustrated in FIG. 7.

FIG. 8 is a diagrammatic cross-sectional view diagrammatically illustrating a state in the step of forming a gate electrode and a drain field electrode after the step illustrated in FIG. 7.

The gate electrode 34 and the drain field electrode 35 are formed by evaporating each of WN (tungsten nitride) and Au to 50 nm and using a lift-off method or etching. Note that the gate electrode 34 is formed so as to cover the surface protective film 36 on the drain region 30d side over the stepped portion 36sg, whereas the drain field electrode 35 is formed so as to cover the surface protective film 36 on the gate electrode 34 side over the stepped portion 36sd.

Simulation results for the function of the impact ionization control layer 24 will be described with reference to FIGS. 9 and 10.

Figure 9:
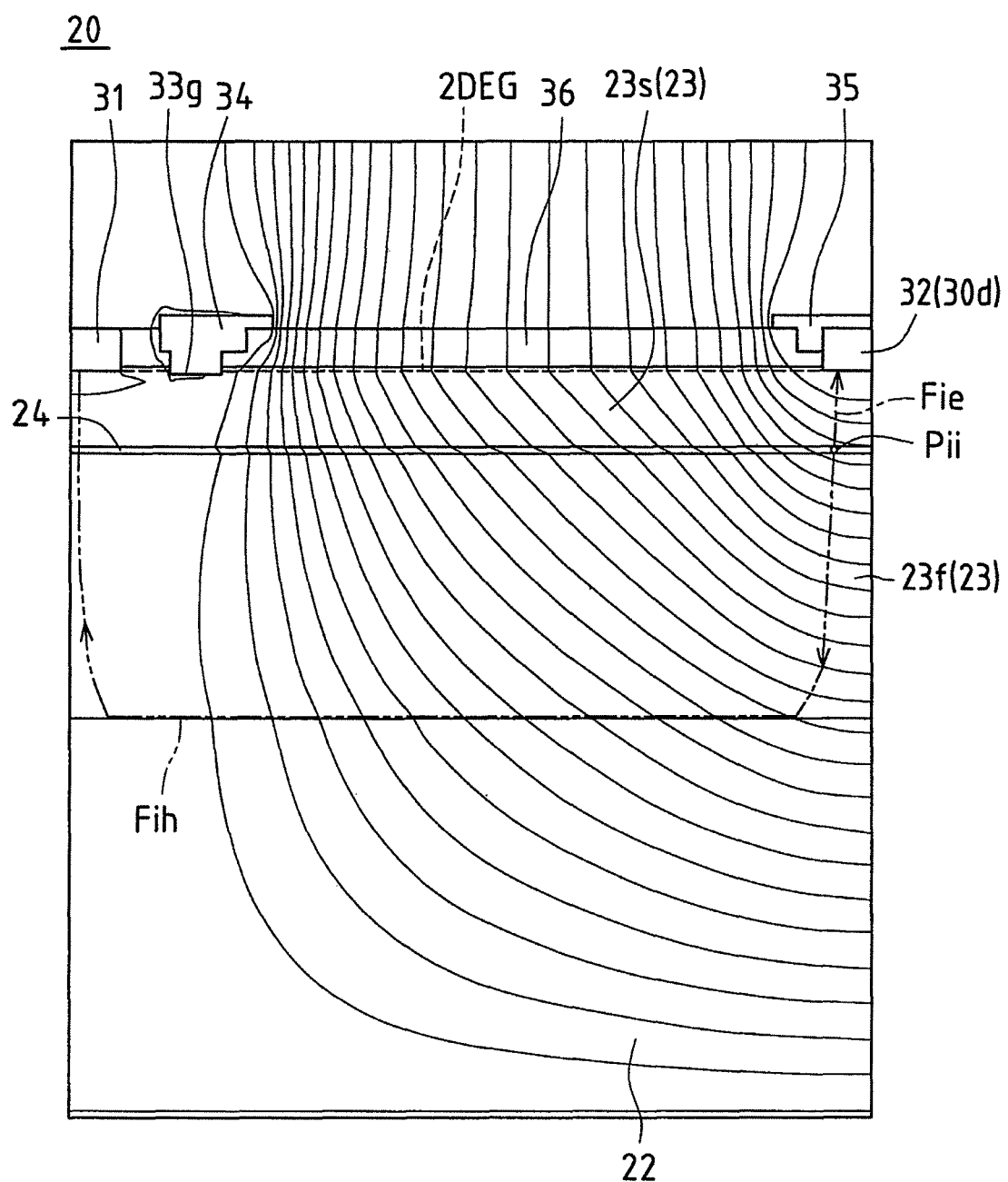
FIG. 9 is a schematic diagram illustrating a simulation result for the situation where impact ionization occurs in the semiconductor device according to the first embodiment of the present invention.

FIG. 9 is a schematic diagram illustrating a simulation result for the situation where impact ionization occurs in the semiconductor device according to the first embodiment of the present invention. Note that only the two-dimensional electron gas layer 2DEG is representatively illustrated because the illustrations of the channel defining compound semiconductor layer 26f, the intermediate layer 27, the channel defining compound semiconductor layer 26s, and the cap layer 29 are difficult in terms of actual dimensions.

Figure 10:
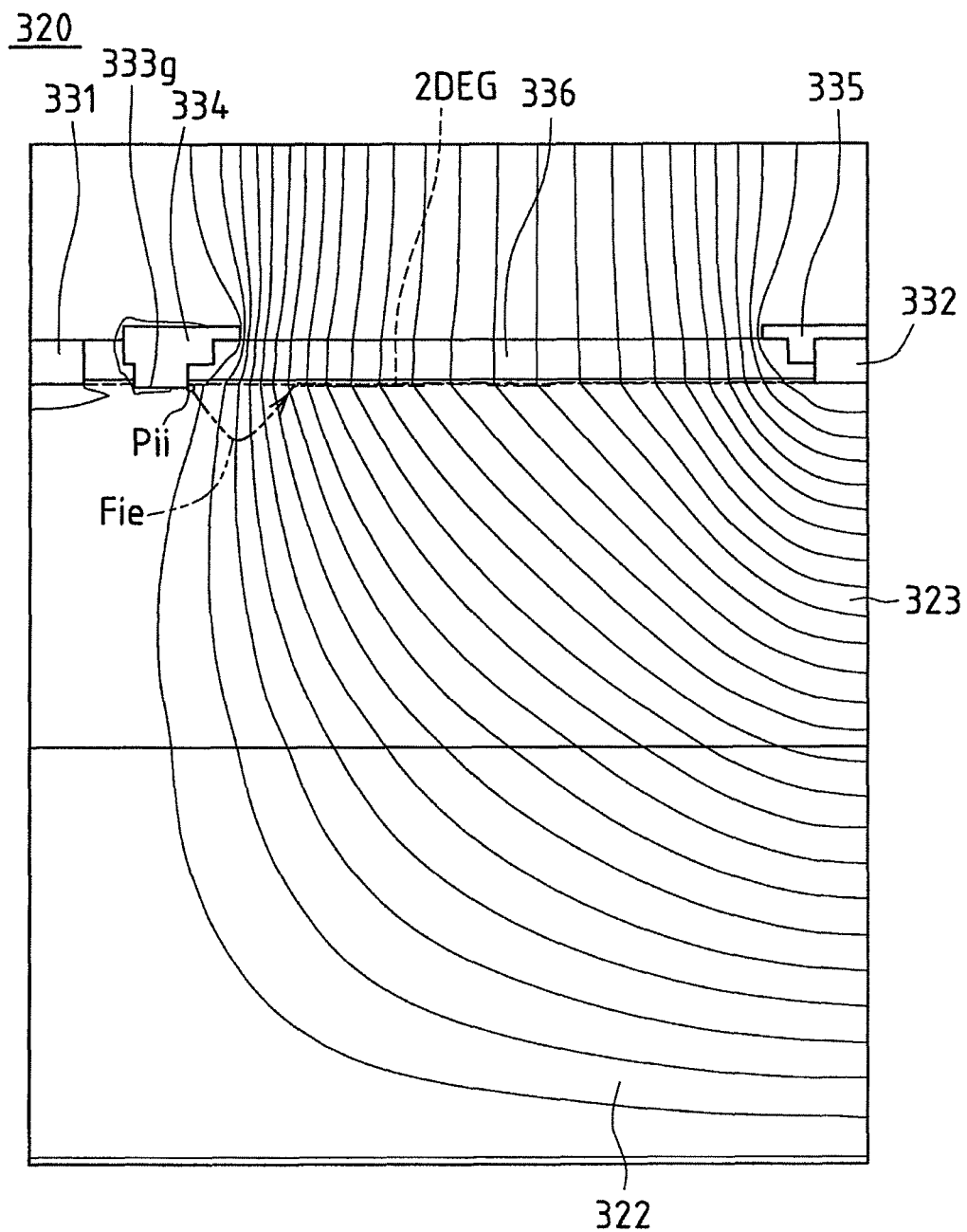
FIG. 10 is a schematic diagram illustrating a simulation result for the situation where impact ionization occurs in a conventional semiconductor device (comparative semiconductor device) that is provide with no impact ionization control layer.

FIG. 10 is a schematic diagram illustrating a simulation result for the situation where impact ionization occurs in a conventional semiconductor device (comparative semiconductor device) that is provided with no impact ionization control layer.

Note that FIGS. 9 and 10 both show the simulation results for the case where a voltage of 1250 V is applied between the source and the drain. Specifically, the state of the electric field (equipotential lines) and the movement of electrons and holes generated due to impact ionization are illustrated. In order to show the movement of electrons and holes, the dimension in the direction of layering is enlarged as compared to the lateral dimension.

The semiconductor device 20 (FIG. 9) according to the present embodiment includes the impact ionization control layer 24. It thus allows impact ionization to occur in the vicinity (at an impact ionization occurrence position Pii) of the drain region 30d before impact ionization occurs in a channel in a region that corresponds to the gate electrode 34.

In other words, the semiconductor device 20 lessens the electric field in a channel in a region that corresponds to the gate electrode 34, i.e., at a position where impact ionization tends to occur conventionally, so that impact ionization is likely to occur in the vicinity of the drain electrode 32 (the drain region 30d) and the impact-ionization occurrence position Pii shifts closer to the vicinity of the drain region 30d than in the conventional case. Note that the electric field strength at the impact ionization occurrence position Pii in the semiconductor device 20 is 5.1 MV/cm, which is the maximum electric field strength observed between the source and the drain.

Since the electrons generated at the impact ionization occurrence position Pii are absorbed by the electric field caused by the drain region 30d (the potential of the drain electrode 32), they accordingly flow into the drain region 30d as an electron flow Fie. Meanwhile, since the holes generated at the impact ionization occurrence position Pii are repelled by the electric field caused by the drain region 30d (the potential of the drain electrode 32), they accordingly flow as a hole flow Fih to the boundary between the base compound semiconductor layer 23f and the buffer layer 22, shift from the drain region 30d side to the source region 30s side along the boundary, and are absorbed into the source region 30s (the source electrode 31).

That is, the electrons generated due to impact ionization are absorbed into the drain region 30d (the drain electrode 32), whereas the holes generated due to impact ionization are absorbed into the source region 30s (the source electrode 31). Hence, since the holes are not accumulated in the region that corresponds to the gate electrode 34 (the gate insulating film 33g), it is possible to reduce variations in the threshold value Vth of the semiconductor device 20 (field-effect transistor), thereby stabilizing operating characteristics and improving reliability.

Unlike the semiconductor device 20 according to the present embodiment, a conventional comparative semiconductor device 320 (FIG. 10) is not provided with an impact ionization control layer, so that impact ionization occurs in a region (at an impact ionization occurrence position Pii) that corresponds to the gate electrode 334 (the gate insulating film 333g). In other words, the impact ionization occurrence position Pii is within a region that corresponds to the gate electrode 334 (gate insulating film 333g). Note that in the comparative semiconductor device 320, the electric field strength at the impact ionization occurrence position Pii is 4.1 MV/cm, which is the maximum electric field strength observed between the source and the drain.

The electrons generated at the impact ionization occurrence position Pii flow to the drain region 332 along the surface as an electron flow Fie. Meanwhile, the holes generated at the impact ionization occurrence position Pii are accumulated in a channel that corresponds to the gate electrode 334 and are not absorbed into the gate electrode 334 because of the presence of the gate insulating film 333g. That is, the holes generated at the impact ionization occurrence position Pii are accumulated in the channel that corresponds to the gate electrode 334, which causes variations in the threshold value Vth, destabilizes operating characteristics, and accordingly reduces reliability.

The structural components of the present embodiment may be combined as appropriate within the range of adaptation to the other embodiments.

The present embodiment has described an example of the case where the semiconductor device 20 is a horizontal MOS-FET. However, the present invention is not limited thereto, and even in the case where the present invention is applied to a horizontal semiconductor device other than a field-effect transistor (FET), it allows control over the location of impact ionization. That is, it is possible to limit an electric field at a position where impact ionization tends to occur conventionally.

Second Embodiment

A semiconductor device according to the present embodiment will be described with reference to FIG. 11. Note that, since the occurrence and effect of impact ionization are as described in the first embodiment and the basic configuration is similar to that of the semiconductor device 20, different points are mainly described herein.

Figure 11:
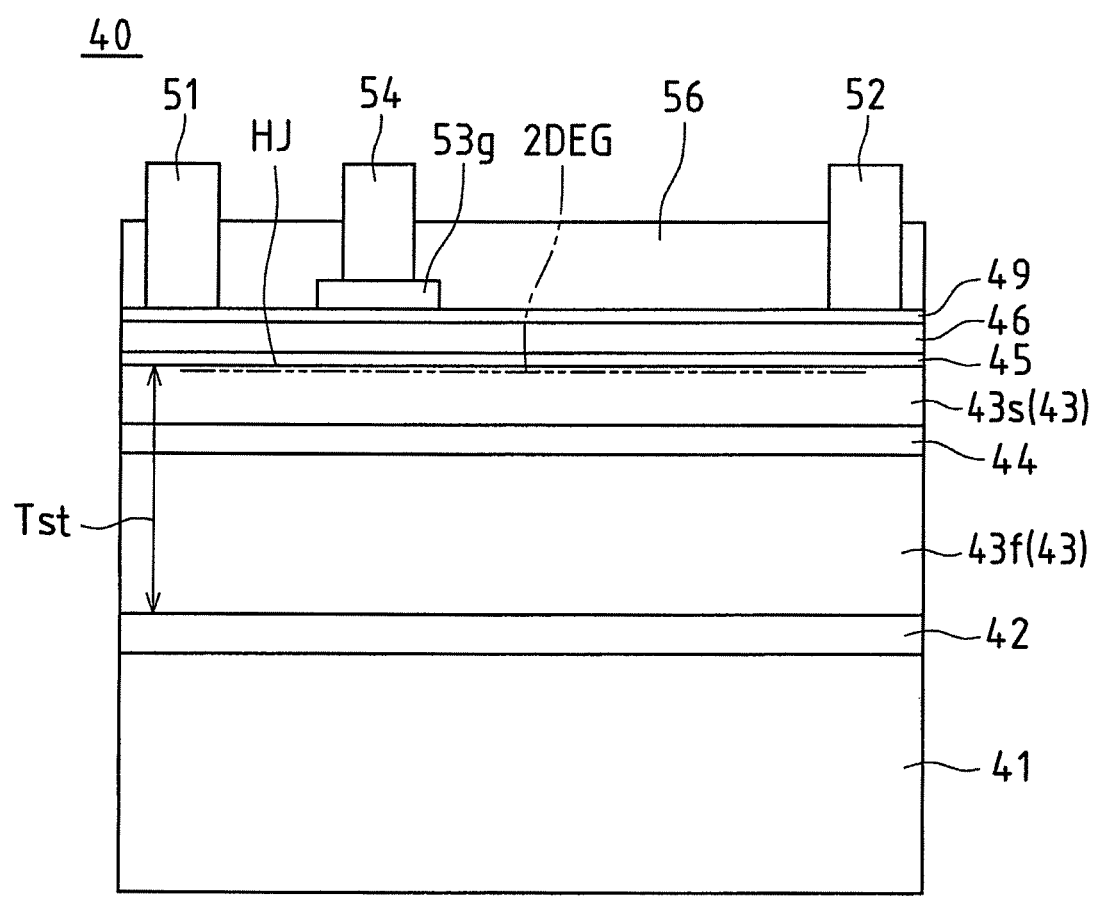
FIG. 11 is a diagrammatic cross-sectional view diagrammatically illustrating a general configuration of a semiconductor device according to a second embodiment of the present invention.

FIG. 11 is a diagrammatic cross-sectional view diagrammatically illustrating a general configuration of a semiconductor device according to a second embodiment of the present invention.

One example of a semiconductor device 40 according to the present embodiment is a field-effect transistor having a compound semiconductor MOS structure.

The semiconductor device 40 includes multiple layers layered in sequence on a substrate 41, namely a buffer layer 42, a base compound semiconductor layer 43f (base compound semiconductor layer 43), an impact ionization control layer 44, a base compound semiconductor layer 43s (base compound semiconductor layer 43), an intermediate layer 45, a channel defining compound semiconductor layer 46, and a cap layer 49.

In the following description, if no distinction is required between the base compound semiconductor layer 43f and the base compound semiconductor layer 43s, they may be simply referred to as the "base compound semiconductor layer 43".

The substrate 41 is a sapphire substrate having a (0001) crystal plane orientation, the buffer layer 42 is a GaN buffer layer having a film thickness of 20 nm, the base compound semiconductor layer 43f is a GaN layer having a film thickness of 3 μm, the impact ionization control layer 44 is an $In_{0.1}Ga_{0.9}N$ (InGaN) layer having a film thickness of 50 nm, the base compound semiconductor layer 43s is a GaN layer having a film thickness of 1 μm, the intermediate layer 45 is an AlN layer having a film thickness of 1 nm, the channel defining compound semiconductor layer 46 is an $Al_{0.2}Ga_{0.8}N$ (AlGaN) layer having a film thickness of 20 nm, and the cap layer 49 is a GaN layer having a film thickness of 1 nm.

Note that the functions of the intermediate layer 45 and the cap layer 49 are similar to those of the intermediate layer 27 and the cap layer 29 described in the first embodiment. Also, while the channel defining compound semiconductor layer 26 according to the first embodiment is configured to include a channel layer and a barrier layer, the channel defining compound semiconductor layer 46 according to the present embodiment is different therefrom in that the base compound semiconductor layer 43 forms a channel layer. The same relationship with the first embodiment applies to the other embodiments described below, so that some descriptions may be omitted as appropriate.

The semiconductor device 40 according to the present embodiment includes the substrate 41, the base compound semiconductor layer 43 (the base compound semiconductor layer 43f and the base compound semiconductor layer 43s) that is layered on the substrate 41 to form a base, and the channel defining compound semiconductor layer 46 that is layered on the base compound semiconductor layer 43 to define a channel.

The semiconductor device 40 further includes the impact ionization control layer 44 that is layered within a layering range (a thickness Tst of the layering range) of the base compound semiconductor layer 43 and controls the location of impact ionization. The base compound semiconductor layer 43 is formed of a first compound semiconductor (GaN), the channel defining compound semiconductor layer 46 is formed of a second compound semiconductor (AlGaN), and the impact ionization control layer 44 is formed of a third compound semiconductor (InGaN such as $In_{0.1}Ga_{0.9}N$) that has a smaller band gap than the first compound semiconductor.

The semiconductor device 40 is thus capable of controlling the location of impact ionization with ease and high precision and thereby efficiently absorbing generated electrons and holes. That is, the holes generated in the vicinity of a drain electrode 52 due to impact ionization move toward the source electrode 51 along the interface between the buffer layer 42 and the base compound semiconductor layer 43f, and are absorbed into the source electrode 51. Meanwhile, the electrons generated due to impact ionization are absorbed into the drain electrode 52.

In other words, it is possible to reduce the influence of electrons and holes generated due to impact ionization on carrier signals and to thereby achieve proper operating characteristics and high reliability.

In the semiconductor device 40, the source electrode 51 and the drain electrode 52 are formed joined (by ohmic contact) to the cap layer 49. Thus, portions of the intermediate layer 45, the channel defining compound semiconductor layer 46, and the cap layer 49 that correspond to the source electrode 51 and the drain electrode 52 constitute a source region and a drain region. A gate insulating film 53g is layered and formed on the cap layer 49 between the source electrode 51 and the drain electrode 52, and a gate electrode 54 is overlaid on the gate insulating film 53g.

The gate insulating film 53g is formed of $SiO_2$ having a film thickness of 20 nm and the gate electrode 54 is formed by overlaying Ni having a film thickness of 50 nm on Au having a film thickness of 50 nm, so as to create a MOS type. That is, the semiconductor device 40 is a horizontal MOS field-effect transistor.

A surface protective film 56 that covers and protects the cap layer 49 (the semiconductor device 40) is formed between the source electrode 51, the drain electrode 52, and the gate electrode 54. The surface protective film 56 is SiNx deposited by plasma CVD and has a refractive index of, for example, 2.0.

The source electrode 51, the drain electrode 52, the gate insulating film 53g, the gate electrode 54, the surface protective film 56, and so on can be formed in the same manner as described in the first embodiment, so that their detailed description will be omitted.

As described above, the semiconductor device 40 includes the gate insulating film 53g formed on the part of the channel defining compound semiconductor layer 46, the gate electrode 54 formed on the gate insulating film 53g, the source electrode 51 arranged on one side of the gate electrode 54, and the drain electrode 52 arranged on the other side of the gate electrode 54, facing to the source electrode 51.

With this configuration, the semiconductor device 40 (the field-effect transistor) is capable of controlling the location of impact ionization in the horizontal field-effect transistor and causing impact ionization to occur in the vicinity of the drain region before impact ionization occurs in a channel that corresponds to the gate electrode 54. This accordingly enables the semiconductor device 40 to absorb electrons and holes generated in the vicinity of the drain region into the drain and/or the source, thus preventing the accumulation of holes in the channel due to impact ionization and thereby achieving proper operating characteristics.

If the film thickness of the base compound semiconductor layer 43f is greater than the film thickness of the base compound semiconductor layer 43s, impact ionization is less likely to occur in the vicinity of the drain region because the electric field spreads in the base compound semiconductor layer 43s and the electric field strength decreases.

It is thus desirable that the impact ionization control layer 44 be arranged closer to the channel defining compound semiconductor layer 46 than the middle between the base compound semiconductor layer 43f and the base compound semiconductor layer 43s.

In the present embodiment, the configuration is designed such that the base compound semiconductor layer 43f has a film thickness of 3 μm, the base compound semiconductor layer 43s has a film thickness of 1 μm, and the impact ionization control layer 44 has a film thickness of 50 nm and is sandwiched between the base compound semiconductor layer 23f and the base compound semiconductor layer 23s.

That is, it is desirable that the impact ionization control layer 44 be arranged closer to the channel defining compound semiconductor layer 46 than the middle (a position about 2 μm away from the ends of the layering range) of the layering range (the thickness Tst of the layering range=3 μm+50 nm+1 μm=4.05 μm) of the base compound semiconductor layer 43.

This configuration suppresses a reduction in the electric field strength in the base compound semiconductor layer 43s arranged on the channel defining compound semiconductor layer 46 side and allows impact ionization to occur with reliability in the vicinity of, for example, the drain region of the field-effect transistor, thus easily achieving a semiconductor device 40 having proper operating characteristics.

The base compound semiconductor layer 43f and the base compound semiconductor layer 43s are formed so that their total film thickness (4 μm) will be the thickness required to provide the required electric field strength. If the thickness of the base compound semiconductor layer 43 is insufficient for the required thickness, the holes generated due to impact ionization collide with the gate insulating film 53g and fail to reach the source region, which makes it difficult to effect the function of the impact ionization control layer 44.

In the semiconductor device 40, the first compound semiconductor (the base compound semiconductor layer 43) is GaN. Thus, a third compound semiconductor (InGaN such as $In_{0.1}Ga_{0.9}N$) that has a smaller band gap than GaN can be adopted as the impact ionization control layer 44.

That is, in the semiconductor device 40, the first compound semiconductor (the base compound semiconductor layer 43f and the base compound semiconductor layer 43s) is GaN, and the third compound semiconductor constituting the impact ionization control layer 44 is InGaN. This configuration allows the base compound semiconductor layer 43 and the impact ionization control layer 44 to be formed with ease and high precision.

The intermediate layer 45 (and the channel defining compound semiconductor layer 46) forms a heterojunction HJ with the base compound semiconductor layer 43 (the base compound semiconductor layer 43s). That is, the channel defining compound semiconductor layer 46 is a barrier layer that provides a barrier against the two-dimensional electron gas layer 2DEG formed in the base compound semiconductor layer 43 (the base compound semiconductor layer 43s). This configuration allows easy formation of the highly concentrated two-dimensional electron gas layer 2DEG, thus achieving a semiconductor device 40 that is capable of operating at high frequency and high power.

The base compound semiconductor layer 43 (the base compound semiconductor layer 43s) is formed of GaN, the intermediate layer 45 is formed of AlN, and the channel defining compound semiconductor layer 46 is formed of AlGaN ($Al_{0.2}Ga_{0.8}N$). The band gap of GaN (the base compound semiconductor layer 43) is smaller than the band gaps of AlN (the intermediate layer 46) and AlGaN (the channel defining compound semiconductor layer 46). Accordingly, the channel defining compound semiconductor layer 46 serves as a barrier layer that provides a barrier against the two-dimensional electron gas layer 2DEG formed in the base compound semiconductor layer 43s.

Note that the two-dimensional electron gas layer 2DEG is formed in the base compound semiconductor layer 43s closer to the boundary with the intermediate layer 45 (the channel defining compound semiconductor layer 46). In other words, the two-dimensional electron gas layer 2DEG as a channel can be easily formed in the GaN layer constituting the base compound semiconductor layer 43 (the base compound semiconductor layer 43s).

The layering of the channel defining compound semiconductor layer 46 (the barrier layer) on the intermediate layer 45 that forms the heterojunction HJ with the base compound semiconductor layer 43 allows an electric field to be generated based on spontaneous polarization and piezopolarization, so that the two-dimensional electron gas layer 2DEG is formed in the base compound semiconductor layer 43s (the base compound semiconductor layer 43) closer to the boundary with the channel defining compound semiconductor layer 46. Also, the layering of the cap layer 49 allows control over the surface condition and the threshold value.

It is desirable that the distance between the impact ionization control layer 44 and the heterojunction HJ (the two-dimensional electron gas layer 2DEG) be in the range of 0.2 μm to 1.0 μm. This configuration reduces the generation of a leakage current caused by the impact ionization control layer 44 and accordingly allows effective absorption of electrons and holes generated due to impact ionization, thus providing the semiconductor device 40 with stable operating characteristics.

In the case where the distance between the impact ionization control layer 44 and the heterojunction HJ is smaller than 0.2 μm, there is a risk that the impact ionization control layer 44 and the drain region (the drain electrode 52) may be in too close proximity to each other and thereby the impact ionization control layer 24 may become a source of current leakage. In the case where the distance between the impact ionization control layer 44 and the heterojunction HJ is larger than 1.0 μm, there is a risk that the impact ionization control layer 44 and the drain region (the drain electrode 52) may be too far away from each other and thereby the impact ionization control layer 44 may not function well.

As described above, in the semiconductor device 40 according to the present embodiment, the first compound semiconductor, the second compound semiconductor, and the third compound semiconductor are desirably nitride semiconductors. This configuration allows excellent characteristics of nitride semiconductors to be reflected, thereby providing the semiconductor device with excellent characteristics. Note that the first compound semiconductor, the second compound semiconductor, and the third compound semiconductor are not limited to nitride semiconductors, and it is possible to adopt compound semiconductors other than nitride semiconductors.

The components of the present embodiment may be combined as appropriate within the range of adaptation to the other embodiments.

Third Embodiment

A semiconductor device according to the present embodiment will be described with reference to FIG. 12. Note that, since the occurrence and effect of impact ionization are as described in the first and second embodiments and the basic configuration is similar to those of the semiconductor devices 20 and 40, different points are mainly described herein.

Figure 12:
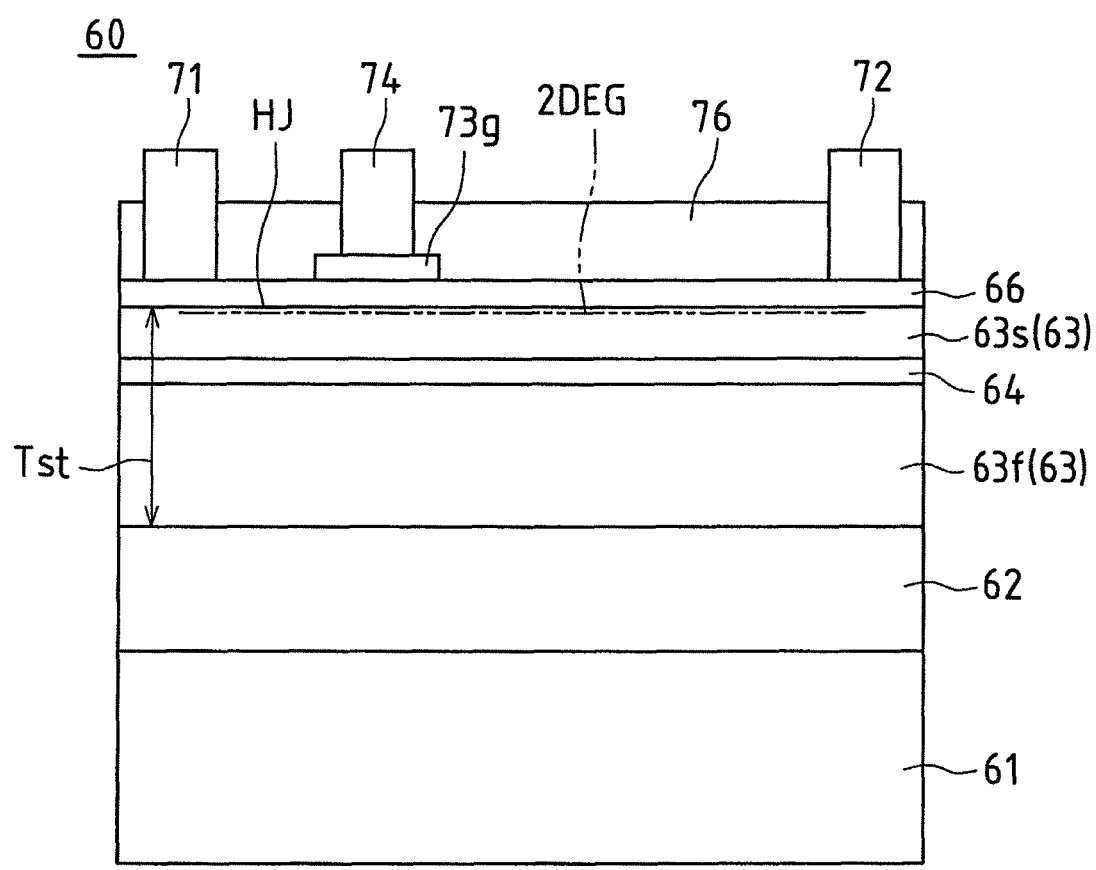
FIG. 12 is a diagrammatic cross-sectional view diagrammatically illustrating a general configuration of a semiconductor device according to a third embodiment of the present invention.

FIG. 12 is a diagrammatic cross-sectional view diagrammatically illustrating a general configuration of a semiconductor device according to a third embodiment of the present invention.

One example of a semiconductor device 60 according to the present embodiment is a field-effect transistor having a compound semiconductor MOS structure.

The semiconductor device 60 according to the present embodiment includes multiple layers layered in sequence on a substrate 61, namely a buffer layer 62, a base compound semiconductor layer 63f (base compound semiconductor layer 63), an impact ionization control layer 64, a base compound semiconductor layer 63s (base compound semiconductor layer 63), and a channel defining compound semiconductor layer 66.

In the following description, if no distinction is required between the base compound semiconductor layer 63f and the base compound semiconductor layer 63s, they may simply be referred to as the "base compound semiconductor layer 63".

The substrate 61 is a highly concentrated p-type Si substrate having a (111) crystal plane orientation, the buffer layer 62 is a GaN/AlN superlattice buffer layer having a film thickness of 2 µm, the base compound semiconductor layer 63f is an $Al_{0.05}Ga_{0.95}N$ layer having a film thickness of 3 µm, the impact ionization control layer 64 is a GaN layer having a film thickness of 50 nm, the base compound semiconductor layer 63s is an $Al_{0.05}Ga_{0.95}N$ layer having a film thickness of 1 µm, and the channel defining compound semiconductor layer 66 is an $Al_{0.2}Ga_{0.8}N$ layer having a film thickness of 20 nm.

That is, the semiconductor device 60 according to the present embodiment includes the substrate 61, the base compound semiconductor layer 63 (the base compound semiconductor layer 63f and the base compound semiconductor layer 63s) that is layered on the substrate 61 to form a base, and the channel defining compound semiconductor layer 66 that is layered on the base compound semiconductor layer 63 to define a channel.

The semiconductor device 60 further includes the impact ionization control layer 64 that is layered within a layering range (a thickness Tst of the layering range) of the base compound semiconductor layer 63 and controls the location of impact ionization. The base compound semiconductor layer 63 is formed of a first compound semiconductor (AlGaN such as $Al_{0.05}Ga_{0.95}N$), the channel defining compound semiconductor layer 66 is formed of a second compound semiconductor (AlGaN such as $Al_{0.2}Ga_{0.8}N$), and the impact ionization control layer 64 is formed of a third compound semiconductor (GaN) that has a smaller band gap than the first compound semiconductor.

The semiconductor device 60 is thus capable of controlling the location of impact ionization with ease and high precision and thereby efficiently absorbing electrons and holes. That is, the holes generated in the vicinity of a drain electrode 72 due to impact ionization move toward a source electrode 71 along the interface between the buffer layer 62 and the base compound semiconductor layer 63f, and are absorbed into the source electrode 71. Meanwhile, the electrons generated due to impact ionization are absorbed into the drain electrode 72.

In other words, it is possible to reduce the influence of electrons and holes generated due to impact ionization on carrier signals and to thereby achieve proper operating characteristics and high reliability.

In the semiconductor device 60, the source electrode 71 and the drain electrode 72 are formed joined (by ohmic contact) to the channel defining compound semiconductor layer 66. Thus, portions of the channel defining compound semiconductor layer 66 that correspond to the source electrode 71 and the drain electrode 72 constitute a source region and a drain region. A gate insulating film 73g is layered and formed on the channel defining compound semiconductor layer 66 between the source electrode 71 and the drain electrode 72, and a gate electrode 74 is overlaid on the gate insulating film 73g.

The gate insulating film 73g is formed of $SiO_2$ having a film thickness of 20 nm and the gate electrode 74 is formed by overlaying Ni having a film thickness of 50 nm on Au having a film thickness of 50 nm, so as to create a MOS type. That is, the semiconductor device 60 is a horizontal MOS field-effect transistor.

A surface protective film 76 that covers and protects the channel defining compound semiconductor layer 66 (the semiconductor device 60) is formed between the source electrode 71, the drain electrode 72, and the gate electrode 74. The surface protective film 76 is SiNx deposited by plasma CVD and has a refractive index of, for example, 2.0.

The source electrode 71, the drain electrode 72, the gate insulating film 73g, the gate electrode 74, the surface protective film 76, and so on can be formed in the same manner as described in the first and second embodiments, so that the detailed description thereof will be omitted.

As described above, the semiconductor device 60 includes the gate insulating film 73g formed on the part of the channel defining compound semiconductor layer 66, the gate electrode 74 formed on the gate insulating film 73g, the source electrode 71 arranged on one side of the gate electrode 74, and the drain electrode 72 arranged on the other side of the gate electrode 74, facing to the source electrode 71.

With this configuration, the semiconductor device 60 (the field-effect transistor) is capable of controlling the location of impact ionization in the horizontal field-effect transistor and causing impact ionization to occur in the vicinity of the drain region before impact ionization occurs in a channel corresponding to the gate electrode 74. This accordingly enables the semiconductor device 60 to absorb electrons and holes generated in the vicinity of the drain region into the drain and the source, thus preventing the accumulation of holes in the channel due to impact ionization and thereby achieving proper operating characteristics.

If the film thickness of the base compound semiconductor layer 63f is greater than the film thickness of the base compound semiconductor layer 63s, impact ionization is unlikely to occur in the vicinity of the drain region because the electric field spreads in the base compound semiconductor layer 63s and the electric field strength decreases.

It is thus desirable that the impact ionization control layer 64 be arranged closer to the channel defining compound semiconductor layer 66 than the middle between the base compound semiconductor layer 63f and the base compound semiconductor layer 63s.

In the present embodiment, the configuration is designed such that the base compound semiconductor layer 63f has a film thickness of 3 µm, the base compound semiconductor layer 63s has a film thickness of 1 µm, and the impact ionization control layer 64 has a film thickness of 50 nm and is sandwiched between the base compound semiconductor layer 63f and the base compound semiconductor layer 63s.

That is, it is desirable that the impact ionization control layer 64 be arranged closer to the channel defining compound semiconductor layer 66 than the middle (a position about 2 µm away from the ends of the layering range) of the layering range (the thickness Tst of the layering range=3 µm+50 nm+1 µm=4.05 µm) of the base compound semiconductor layer 63.

This configuration suppresses a reduction in the electric field strength in the base compound semiconductor layer 63s arranged on the channel defining compound semiconductor layer 66 side and allows impact ionization to occur with reliability in the vicinity of, for example, the drain region of the field-effect transistor, thus easily achieving a semiconductor device 60 having proper operating characteristics.

The base compound semiconductor layer 63f and the base compound semiconductor layer 63s are formed so that their total film thickness thickness (4 µm) is sufficient to provide the required electric field strength. If the thickness of the base compound semiconductor layer 63 is insufficient for the required thickness, the holes generated due to impact ionization collide with the gate insulating film 73g and fail to reach the source region, which makes it difficult to effect the function of the impact ionization control layer 64.

Moreover, if the substrate 61 is a non-isolating substrate (e.g., a Si substrate), the electric field in the base compound semiconductor layer 63 varies under the influence of the electric field from the substrate 61. That is, in order to stabilize the function of the impact ionization control layer 64, it is necessary to reduce the influence of the electric field from the substrate 61 on the base compound semiconductor layer 63.

It is thus desirable that the sum of the film thickness of the base compound semiconductor layer 63*f* and the film thickness of the base compound semiconductor layer 63*s* be made greater than half the film thickness of the buffer layer 62 so as to secure the required thickness of the base compound semiconductor layer 63 for securing the electric field strength and to reduce the influence of the electric field from the substrate 61 on the base compound semiconductor layer 63 in order to stabilize the electric field in the base compound semiconductor layer 63.

The semiconductor device 60 includes the buffer layer 62 that is arranged between the substrate 61 and the base compound semiconductor layer 63 so as to provide crystal lattice matching. If the substrate 61 is a non-isolating substrate, the thickness Tst (4.25 µm) of the layering range of the base compound semiconductor layer 63 is made greater than half the thickness (2 µm/2=1 µm) of the buffer layer 62.

This configuration secures the required film thickness for the base compound semiconductor layer 63, thus reducing the influence of the electric field from the substrate 61 (the non-isolating substrate) through the buffer layer 62 on the base compound semiconductor layer 63 and accordingly allowing reliable control over the occurrence of impact ionization.

In the semiconductor device 60, the first compound semiconductor (the base compound semiconductor layer 63) is AlGaN (e.g., $Al_{0.05}Ga_{0.95}N$). Thus, a third compound semiconductor that has a smaller band gap than AlGaN ($Al_{0.05}Ga_{0.95}N$) (such as InGaN, GaN, or AlGaN that has a lower Al mixed crystal ratio than the AlGaN of the first compound semiconductor (see Embodiment 4)) can be adopted as the impact ionization control layer 64.

That is, in the semiconductor device 60, the first compound semiconductor (the base compound semiconductor layer 63*f* and the base compound semiconductor layer 63*s*) is AlGaN, and the third compound semiconductor constituting the impact ionization control layer 64 is any one of InGaN, GaN, and AlGaN that has a lower Al mixed crystal ratio than the AlGaN of the first compound semiconductor. This configuration allows the base compound semiconductor layer 63 and the impact ionization control layer 64 to be formed with ease and high precision.

The channel defining compound semiconductor layer 66 forms a heterojunction HJ with the base compound semiconductor layer 63 (the base compound semiconductor layer 63*s*). That is, the channel defining compound semiconductor layer 66 is a barrier layer that provides a barrier against the two-dimensional electron gas layer 2DEG formed in the base compound semiconductor layer 63 (the base compound semiconductor layer 63*s*). This configuration allows easy formation of the highly concentrated two-dimensional electron gas layer 2DEG, thus achieving a semiconductor device 60 that is capable of operating at high frequency and high power.

The base compound semiconductor layer 63 (the base compound semiconductor layer 63*s*) is formed of AlGaN (e.g., $Al_{0.05}Ga_{0.95}N$), and the channel defining compound semiconductor layer 66 is formed of AlGaN (e.g., $Al_{0.2}Ga_{0.8}N$) that has a higher Al mixed crystal ratio than the AlGaN of the base compound semiconductor layer 63. The band gap of $Al_{0.05}Ga_{0.95}N$ (the base compound semiconductor layer 63) is smaller than the band gap of $Al_{0.2}Ga_{0.8}N$ (the channel defining compound semiconductor layer 66). Accordingly, the channel defining compound semiconductor layer 66 serves as a barrier layer against the two-dimensional electron gas layer 2DEG formed in the base compound semiconductor layer 63.

Note that the two-dimensional electron gas layer 2DEG is formed in the base compound semiconductor layer 63*s* closer to the boundary with the channel defining compound semiconductor layer 66. In other words, the two-dimensional electron gas layer 2DEG as a channel can be easily formed in the AlGaN layer constituting the base compound semiconductor layer 63 (the base compound semiconductor layer 63*s*).

It is desirable that the distance between the impact ionization control layer 64 and the heterojunction HJ (the two-dimensional electron gas layer 2DEG) be in the range of 0.2 µm to 1.0 µm. This configuration reduces the generation of a leakage current caused by the impact ionization control layer 64 and accordingly allows effective absorption of electrons and holes generated due to impact ionization, thus providing the semiconductor device 60 with stable operating characteristics.

In the case where the distance between the impact ionization control layer 64 and the heterojunction HJ is smaller than 0.2 µm, there is a risk that the impact ionization control layer 64 and the drain region (the drain electrode 72) may be in too close proximity to each other and thereby the impact ionization control layer 64 may become a source of current leakage. In the case where the distance between the impact ionization control layer 64 and the heterojunction HJ is larger than 1.0 µm, there is a risk that the impact ionization control layer 64 and the drain region (the drain electrode 72) may be too far away from each other and thereby the impact ionization control layer 64 may not function well.

As described above, in the semiconductor device 60 according to the present embodiment, the first compound semiconductor, the second compound semiconductor, and the third compound semiconductor are desirably nitride semiconductors. This configuration allows excellent characteristics of nitride semiconductors to be reflected, thereby providing the semiconductor device with excellent characteristics. Note that the first compound semiconductor, the second compound semiconductor, and the third compound semiconductor are not limited to nitride semiconductors, and it is possible to adopt compound semiconductors other than nitride semiconductors.

The components of the present embodiment may be combined as appropriate within the range of adaptation to the other embodiments.

Fourth Embodiment

A semiconductor device according to the present embodiment will be described with reference to FIG. 13. Note that, since the occurrence and effect of impact ionization are as described in the first to third embodiments and the basic configuration is similar to those of the semiconductor devices 20, 40, and 60, different points are mainly described herein.

Figure 13:
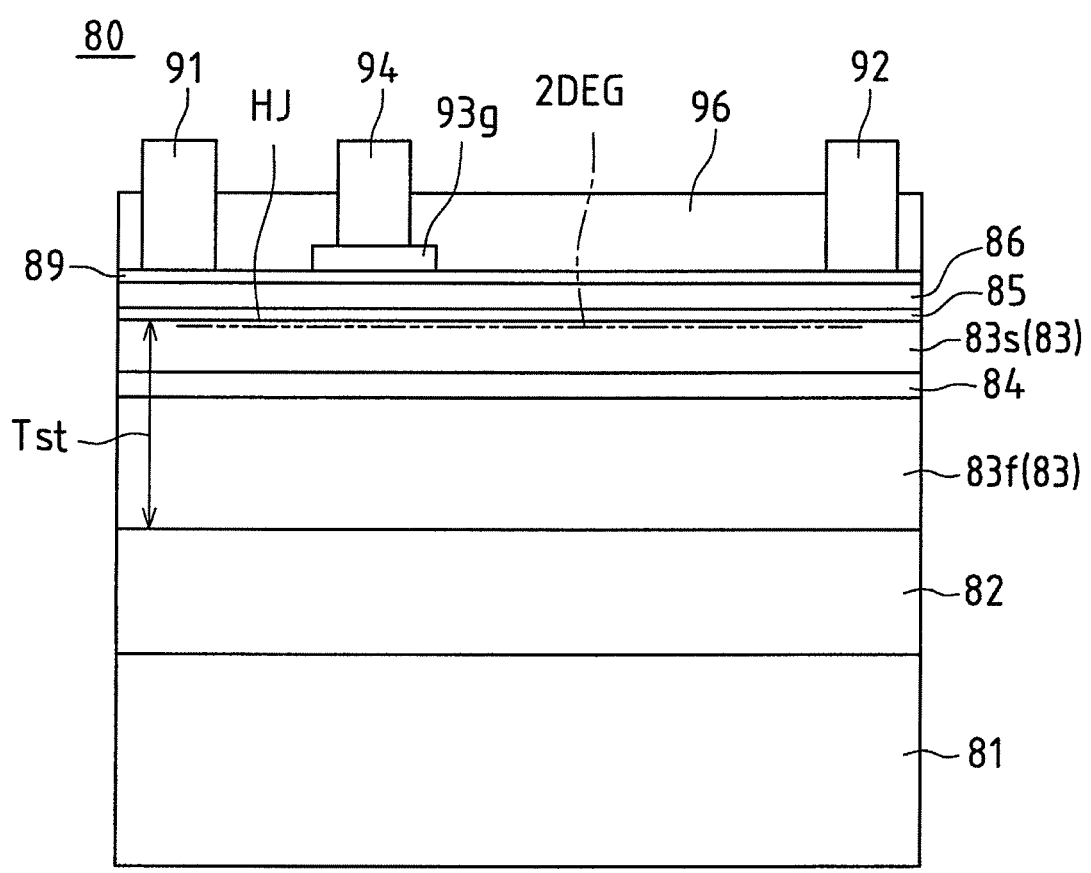
FIG. 13 is a diagrammatic cross-sectional view diagrammatically illustrating a general configuration of a semiconductor device according to a fourth embodiment of the present invention.

FIG. 13 is a diagrammatic cross-sectional view diagrammatically illustrating a general configuration of a semiconductor device according to a fourth embodiment of the present invention.

One example of the semiconductor device 80 according to the present embodiment is a field-effect transistor having a compound semiconductor MOS structure.

The semiconductor device 80 according to the present embodiment includes multiple layers layered in sequence on a substrate 81, namely a buffer layer 82, a base compound semiconductor layer 83*f* (base compound semiconductor layer 83), an impact ionization control layer 84, a base compound semiconductor layer 83*s* (base compound semiconductor layer 83), an intermediate layer 85, a channel defining compound semiconductor layer 86, and a cap layer 89.

In the following description, if no distinction is required between the base compound semiconductor layer 83*f* and the base compound semiconductor layer 83s, they may be simply referred to as the "base compound semiconductor layer 83".

The substrate 81 is a highly concentrated p-type Si substrate having a (111) crystal plane orientation, the buffer layer 82 is a GaN/AlN superlattice buffer layer having a film thickness of 2 μm, the base compound semiconductor layer 83f is an $Al_{0.1}Ga_{0.9}N$ layer having a film thickness of 3 μm, the impact ionization control layer 84 is an $Al_{0.05}Ga_{0.95}N$ layer having a film thickness of 50 nm, the base compound semiconductor layer 83s is an $Al_{0.1}Ga_{0.9}N$ layer having a film thickness of 1 μm, the intermediate layer 85 is an AlN layer having a film thickness of 1 nm, the channel defining compound semiconductor layer 86 is an $Al_{0.4}Ga_{0.6}N$ layer having a film thickness of 20 nm, and the cap layer 89 is a GaN layer having a film thickness of 1 nm.

That is, the semiconductor device 80 according to the present embodiment includes the substrate 81, the base compound semiconductor layer 83 (the base compound semiconductor layer 83f and the base compound semiconductor layer 83s) that is layered on the substrate 81 to form a base, and the channel defining compound semiconductor layer 86 that is layered on the base compound semiconductor layer 83 to define a channel.

Note that the Al mixed crystal ratio in the channel defining compound semiconductor layer 86 is 0.4, i.e., it is more than 0.3. Since it is generally said that a layer having an Al mixed crystal ratio of more than 0.3 is susceptible to the influence of oxygen, the cap layer 89 is layered on the surface of the channel defining compound semiconductor layer 86 in order to reduce the influence of oxygen.

The semiconductor device 80 further includes the impact ionization control layer 84 that is layered within a layering range (a thickness Tst of the layering range) of the base compound semiconductor layer 83 and controls the location of impact ionization. The base compound semiconductor layer 83 is formed of a first compound semiconductor (AlGaN such as $Al_{0.1}Ga_{0.9}N$), the channel defining compound semiconductor layer 86 is formed of a second compound semiconductor (AlGaN), and the impact ionization control layer 84 is formed of a third compound semiconductor (AlGaN such as $Al_{0.05}Ga_{0.95}N$) that has a smaller band gap than the first compound semiconductor.

The semiconductor device 80 is thus capable of controlling the location of impact ionization with ease and high precision and thereby efficiently absorbing electrons and holes. That is, the holes generated in the vicinity of a drain electrode 92 due to impact ionization move toward a source electrode 91 along the interface between the buffer layer 82 and the base compound semiconductor layer 83f, and are absorbed into the source electrode 91. Meanwhile, the electrons generated due to impact ionization are absorbed into the drain electrode 92.

In other words, it is possible to reduce the influence of electrons and holes generated due to impact ionization on carrier signals and to thereby achieve proper operating characteristics and high reliability.

In the semiconductor device 80, the source electrode 91 and the drain electrode 92 are formed joined (by ohmic contact) to the cap layer 89. Thus, portions of the intermediate layer 85, the channel defining compound semiconductor layer 86, and the cap layer 89 that correspond to the source electrode 91 and the drain electrode 92 constitute a source region and a drain region. A gate insulating film 93g is layered and formed on the cap layer 89 between the source electrode 91 and the drain electrode 92, and a gate electrode 94 is overlaid on the gate insulating film 93g.

The gate insulating film 93g is formed of $SiO_2$ having a film thickness of 20 nm and the gate electrode 94 is formed by overlaying Ni having a film thickness of 50 nm on Au having a film thickness of 50 nm, so as to create a MOS type. That is, the semiconductor device 80 is a horizontal MOS field-effect transistor.

A surface protective film 96 that covers and protects the cap layer 89 (the semiconductor device 40) is formed between the source electrode 91, the drain electrode 92, and the gate electrode 94. The surface protective film 96 is SiNx deposited by plasma CVD and has a refractive index of, for example, 2.0.

The source electrode 91, the drain electrode 92, the gate insulating film 93g, the gate electrode 94, the surface protective film 96, and the like can be formed in the same manner as described in the first to third embodiments, so that their detailed description will be omitted.

As described above, the semiconductor device 80 includes the gate insulating film 93g formed on the part of the channel defining compound semiconductor layer 86, the gate electrode 94 formed on the gate insulating film 93g, the source electrode 91 arranged on one side of the gate electrode 94, and the drain electrode 92 arranged on the other side of the gate electrode 94, facing to the source electrode 91.

With this configuration, the semiconductor device 80 (the field-effect transistor) is capable of controlling the location of impact ionization in the horizontal field-effect transistor and causing impact ionization to occur in the vicinity of the drain region before impact ionization occurs in a channel that corresponds to the gate electrode 94. This accordingly enables the semiconductor device 80 to absorb electrons and holes generated in the vicinity of the drain region into the drain and the source, thus preventing the accumulation of holes in the channel due to impact ionization and thereby achieving proper operating characteristics.

If the film thickness of the base compound semiconductor layer 83f is greater than the film thickness of the base compound semiconductor layer 83s, impact ionization is less likely to occur in the vicinity of the drain region because the electric field spreads in the base compound semiconductor layer 83s and the electric field strength decreases.

It is thus desirable that the impact ionization control layer 84 be arranged closer to the channel defining compound semiconductor layer 86 than the middle between the base compound semiconductor layer 83f and the base compound semiconductor layer 83s.

In the present embodiment, the configuration is designed such that the base compound semiconductor layer 83f has a film thickness of 3 μm, the base compound semiconductor layer 83s has a film thickness of 1 μm, and the impact ionization control layer 84 has a film thickness of 50 nm and is sandwiched between the base compound semiconductor layer 83f and the base compound semiconductor layer 83s.

That is, it is desirable that the impact ionization control layer 84 be arranged closer to the channel defining compound semiconductor layer 86 than the middle (a position about 2 μm away from the ends of the layering range) of the layering range (the thickness Tst of the layering range=3 μm+50 nm+1 μm=4.05 μm) of the base compound semiconductor layer 83.

This configuration suppresses a reduction in the electric field strength in the base compound semiconductor layer 83s arranged on the channel defining compound semiconductor layer 86 side and allows impact ionization to occur with reliability in the vicinity of, for example, the drain region of the field-effect transistor, thus easily achieving a semiconductor device 80 having proper operating characteristics.

The base compound semiconductor layer 83f and the base compound semiconductor layer 83s are formed so that their total film thickness (4 μm) will be the thickness required to provide the required electric field strength. If the thickness of the base compound semiconductor layer 83 is insufficient for the required thickness, the holes generated due to impact ionization collide with the gate insulating film 83g and fail to reach the source region, which makes it difficult to effect the function of the impact ionization control layer 84.

Moreover, if the substrate 81 is a non-isolating substrate (e.g., a Si substrate), the electric field in the base compound semiconductor layer 83 varies under the influence of the electric field from the substrate 81. That is, in order to stabilize the function of the impact ionization control layer 84, it is necessary to reduce the influence of the electric field from the substrate 81 on the base compound semiconductor layer 83.

It is thus desirable that the sum of the film thickness of the base compound semiconductor layer 83f and the film thickness of the base compound semiconductor layer 83s be made greater than half the film thickness of the buffer layer 82 so as to secure the required thickness of the base compound semiconductor layer 83 for securing the electric field strength and to reduce the influence of the electric field from the substrate 81 on the base compound semiconductor layer 83 in order to stabilize the electric field in the base compound semiconductor layer 83.

The semiconductor device 80 includes the buffer layer 82 that is arranged between the substrate 81 and the base compound semiconductor layer 83 to provide crystal lattice matching. If the substrate 81 is a non-isolating substrate, the thickness Tst (4.05 µm) of the layering range of the base compound semiconductor layer 83 is made greater than half the thickness (2 µm/2=1 µm) of the buffer layer 82.

This configuration secures the required film thickness of the base compound semiconductor layer 83, thus reducing the influence of the electric field from the substrate 81 (non-isolating substrate) through the buffer layer 82 on the base compound semiconductor layer 83 and accordingly allowing reliable control over the occurrence of impact ionization.

In the semiconductor device 80, the first compound semiconductor (the base compound semiconductor layer 83) is AlGaN (e.g., $Al_{0.1}Ga_{0.9}N$). Thus, a third compound semiconductor that has a smaller band gap than AlGaN ($Al_{0.1}Ga_{0.9}N$) (such as InGaN, GaN, or AlGaN (e.g., $Al_{0.05}Ga_{0.95}N$) having a lower Al mixed crystal ratio than the AlGaN of the first compound semiconductor) can be adopted as the impact ionization control layer 84.

That is, in the semiconductor device 80, the first compound semiconductor (the base compound semiconductor layer 83f and the base compound semiconductor layer 83s) is AlGaN, and the third compound semiconductor constituting the impact ionization control layer 84 is any one of InGaN, GaN, and AlGaN that lower Al mixed crystal ratio than the AlGaN of the first compound semiconductor. This configuration allows the base compound semiconductor layer 83 and the impact ionization control layer 84 to be formed with ease and high precision.

The intermediate layer 85 and the channel defining compound semiconductor layer 86 form a heterojunction HJ with the base compound semiconductor layer 83 (the base compound semiconductor layer 83s). That is, the channel defining compound semiconductor layer 86 is a barrier layer that provides a barrier against the two-dimensional electron gas layer 2DEG formed in the base compound semiconductor layer 83 (the base compound semiconductor layer 83s). This configuration allows easy formation of the highly concentrated two-dimensional electron gas layer 2DEG, thus achieving a semiconductor device 80 that is capable of operating at high frequency and high power.

The base compound semiconductor layer 83 (the base compound semiconductor layer 83s) is formed of AlGaN (e.g., $Al_{0.1}Ga_{0.9}N$), the intermediate layer 85 is formed of AlN, and the channel defining compound semiconductor layer 86 is formed of AlGaN (e.g., an $Al_{0.4}Ga_{0.6}N$ layer) that has a higher Al mixed crystal ratio than the AlGaN of the base compound semiconductor layer 83. The band gap of $Al_{0.1}Ga_{0.9}N$ (the base compound semiconductor layer 83) is smaller than the band gaps of AlN (the intermediate layer 85) and $Al_{0.4}Ga_{0.6}N$ (the channel defining compound semiconductor layer 86). Accordingly, the channel defining compound semiconductor layer 86 serves as a barrier layer against the two-dimensional electron gas layer 2DEG formed in the base compound semiconductor layer 83.

Note that the two-dimensional electron gas layer 2DEG is formed in the base compound semiconductor layer 83s closer to the boundary with the intermediate layer 85 (the channel defining compound semiconductor layer 86). In other words, the two-dimensional electron gas layer 2DEG as a channel can be easily formed in the AlGaN layer constituting the base compound semiconductor layer 83 (the base compound semiconductor layer 83s).

The layering of the channel defining compound semiconductor layer 86 (the barrier layer) on the intermediate layer 85 that forms the heterojunction HJ with the base compound semiconductor layer 83 allows an electric field to be generated based on spontaneous polarization and piezopolarization, so that the two-dimensional electron gas layer 2DEG is formed the base compound semiconductor layer 83s (the base compound semiconductor layer 83) closer to the boundary with the channel defining compound semiconductor layer 86. Also, the layering of the cap layer 89 allows control over the surface condition and the threshold value.

It is desirable that the distance between the impact ionization control layer 84 and the heterojunction HJ (the two-dimensional electron gas layer 2DEG) be in the range of 0.2 µm to 1.0 µm. This configuration reduces the generation of a leakage current caused by the impact ionization control layer 84 and accordingly allows effective absorption of electrons and holes generated due to impact ionization, thus providing the semiconductor device 80 with stable operating characteristics.

In the case where the distance between the impact ionization control layer 84 and the heterojunction HJ is smaller than 0.2 µm, there is a risk that the impact ionization control layer 84 and the drain region (the drain electrode 92) may be in too close proximity to each other and accordingly the impact ionization control layer 84 may become a source of current. In the case where the distance between the impact ionization control layer 84 and the heterojunction HJ is larger than 1.0 µm, there is a risk that the impact ionization control layer 84 and the drain region (the drain electrode 92) may be too apart from each other and accordingly the impact ionization control layer 84 may not function well.

As described above, in the semiconductor device 80 according to the present embodiment, the first compound semiconductor, the second compound semiconductor, and the third compound semiconductor are desirably nitride semiconductors. This configuration allows excellent characteristics of nitride semiconductors to be reflected, thereby providing the semiconductor device with excellent characteristics. Note that the first compound semiconductor, the second compound semiconductor, the third compound semiconductor are not limited to nitride semiconductors, and it is possible to adopt compound semiconductors other than nitride semiconductors.

The components of the present embodiment may be combined as appropriate within the range of adaptation to the other embodiments.

Fifth Embodiment

A semiconductor device according to the present embodiment will be described with reference to FIG. 14. Note that, since the occurrence and effect of impact ionization are as described in the first to fourth embodiments and the basic configuration is identical to those of the semiconductor devices 20, 40, and 60, different points are mainly described herein.

Figure 14:
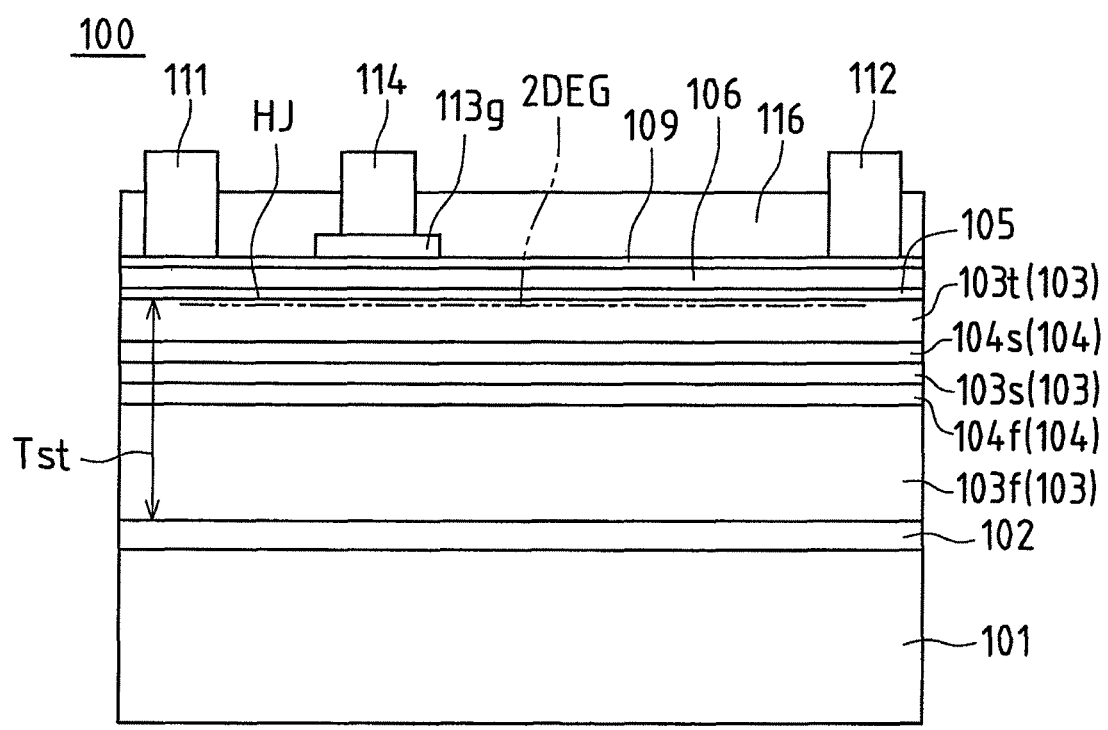
FIG. 14 is a diagrammatic cross-sectional view diagrammatically illustrating a general configuration of a semiconductor device according to a fifth embodiment of the present invention.

FIG. 14 is a diagrammatic cross-sectional view diagrammatically illustrating a general configuration of a semiconductor device according to a fifth embodiment of the present invention.

One example of a semiconductor device 100 according to the present embodiment is a field-effect transistor having a compound semiconductor MOS structure.

Note that, as will be described below, the semiconductor device 100 according to the present embodiment is also a variation of the semiconductor device 40 according to the second embodiment, in which multiple impact ionization control layers 44 are formed in the region of the base compound semiconductor layer 43. That is, the semiconductor device 100 according to the present embodiment includes a two-layered impact ionization control layer 104 (an impact ionization control layer 104f and an impact ionization control layer 104s) formed in a base compound semiconductor layer 103. The base compound semiconductor layer 103 accordingly has a three-layered structure (a base compound semiconductor layer 103f, a base compound semiconductor layer 103s, and a base compound semiconductor layer 103t).

The semiconductor device 100 includes multiple layers layered in sequence on a substrate 101, namely a buffer layer 102, the base compound semiconductor layer 103f (base compound semiconductor layer 103), an impact ionization control layer 104f (impact ionization control layer 104), the base compound semiconductor layer 103s (base compound semiconductor layer 103), the impact ionization control layer 104s (impact ionization control layer 104), the base compound semiconductor layer 103t (base compound semiconductor layer 103), an intermediate layer 105, a channel defining compound semiconductor layer 106, and a cap layer 109.

In the following description, if no distinction is required among the base compound semiconductor layer 103f, the base compound semiconductor layer 103s, and the base compound semiconductor layer 103t, they may be simply referred to as the "base compound semiconductor layer 103". Also, if no distinction is required between the impact ionization control layer 104f and the impact ionization control layer 104s, they may be simply referred to as the "impact ionization control layer 104".

The substrate 101 is a sapphire substrate having a (0001) crystal plane orientation, the buffer layer 102 is a GaN buffer layer having a film thickness of 20 nm, the base compound semiconductor layer 103f is a GaN layer having a film thickness of 3 μm, the impact ionization control layer 104f is an $In_{0.1}Ga_{0.9}N$ layer having a film thickness of 50 nm, the base compound semiconductor layer 103s is a GaN layer having a film thickness of 50 nm, the impact ionization control layer 104s is an $In_{0.1}Ga_{0.9}N$ layer having a film thickness of 50 nm, the base compound semiconductor layer 103t is a GaN layer having a film thickness of 1 μm, the intermediate layer 105 is an AlN layer having a film thickness of 1 nm, the channel defining compound semiconductor layer 106 is an $Al_{0.2}Ga_{0.8}N$ (AlGaN) layer having a film thickness of 20 nm, and the cap layer 109 is a GaN layer having a film thickness of 1 nm.

That is, the semiconductor device 100 according to the present embodiment includes the substrate 101, the base compound semiconductor layer 103 (the base compound semiconductor layer 103f, the base compound semiconductor layer 103s, and the base compound semiconductor layer 103t) that is layered on the substrate 101 to form a base, and the channel defining compound semiconductor layer 106 that is layered on the base compound semiconductor layer 103 to define a channel.

The semiconductor device 100 further includes the impact ionization control layer 104 that is layered within a layering range (a thickness Tst of the layering range) of the base compound semiconductor layer 103 and controls the location of impact ionization. The base compound semiconductor layer 103 is formed of a first compound semiconductor (GaN), the channel defining compound semiconductor layer 106 is formed of a second compound semiconductor (AlGaN), and the impact ionization control layer 104 is formed of a third compound semiconductor (InGaN such as $In_{0.1}Ga_{0.9}N$) that has a smaller band gap than the first compound semiconductor (GaN).

The semiconductor device 100 is thus capable of controlling the location of impact ionization with ease and high precision and thereby efficiently absorbing generated electrons and holes. That is, the holes generated in the vicinity of a drain electrode 112 due to impact ionization move toward a source electrode 111 along the interface between the buffer layer 102 and the base compound semiconductor layer 103f, and are absorbed into the source electrode 111. Meanwhile, the electrons generated due to impact ionization are absorbed into the drain electrode 112.

In other words, it is possible to reduce the influence of electrons and holes generated due to impact ionization on carrier signals and to thereby achieve proper operating characteristics and high reliability.

In the semiconductor device 100, the source electrode 111 and the drain electrode 112 are formed joined (by ohmic contact) to the cap layer 109. Thus, portions of the intermediate layer 105, the channel defining compound semiconductor layer 106, and the cap layer 109 that correspond to the source electrode 111 and the drain electrode 112 constitute a source region and a drain region. A gate insulating film 113g is layered on the cap layer 109 between the source electrode 111 and the drain electrode 112, and a gate electrode 114 is overlaid on the gate insulating film 113g.

The gate insulating film 113g is formed of $SiO_2$ having a film thickness of 20 nm and the gate electrode 114 is formed by overlaying Ni having a film thickness of 50 nm over Au having a film thickness of 50 nm, so as to create a MOS type. That is, the semiconductor device 100 is a horizontal MOS field-effect transistor.

A surface protective film 116 that covers and protects the cap layer 109 (the semiconductor device 100) is formed between the source electrode 111, the drain electrode 112, and the gate electrode 114. The surface protective film 116 is SiNx deposited by plasma CVD and has a refractive index of, for example, 2.0.

The source electrode 111, the drain electrode 112, the gate insulating film 113g, the gate electrode 114, the surface protective film 116, and so on can be formed in the same manner as described in the first to fourth embodiments, so that the detailed description thereof will be omitted.

Note that, in the semiconductor device 100 according to the present embodiment, multiple impact ionization control layers 104 are formed in the direction of layering within the region of the base compound semiconductor layer 103. That is, the base compound semiconductor layer 103 is composed of the base compound semiconductor layer 103*f*, the base compound semiconductor layer 103*s*, and the base compound semiconductor layer 103*t*, and the impact ionization control layer 104 is composed of the impact ionization control layer 104*f* and the impact ionization control layer 104*s*. Specifically, the impact ionization control layer 104*f* is formed between the base compound semiconductor layer 103*f* and the base compound semiconductor layer 103*s*, and the impact ionization control layer 104*s* is formed between the base compound semiconductor layer 103*s* and the base compound semiconductor layer 103*t*.

This configuration allows higher precision control over the impact ionization control layer 104 and accordingly allows easy and high-precision control over the occurrence of impact ionization. Note that the impact ionization control layer 104*f*, the base compound semiconductor layer 103*s*, and the impact ionization control layer 104*s* are desirably have the same film thickness in view of control over electric fields and film formation.

As described above, the semiconductor device 100 includes the gate insulating film 113*g* formed on the part of the channel defining compound semiconductor layer 106, the gate electrode 114 formed on the gate insulating film 113*g*, the source electrode 111 arranged on one side of the gate electrode 114, and the drain electrode 112 arranged on the other side of the gate electrode 114, facing to the source electrode 111.

With this configuration, the semiconductor device 100 (the field-effect transistor) is capable of controlling the location of impact ionization in the horizontal field-effect transistor and causing impact ionization to occur in the vicinity of the drain region before impact ionization occurs in a region corresponding to the gate electrode 114. This accordingly enables the semiconductor device 100 to absorb electrons and holes generated in the vicinity of the drain region into the drain and the source, thus preventing the accumulation of holes in a channel due to impact ionization and thereby achieving proper operating characteristics.

If the film thickness of the base compound semiconductor layer 103*f* is greater than the film thickness of the base compound semiconductor layer 103*t*, impact ionization is less likely to occur in the vicinity of the drain region because an electric field spreads in the base compound semiconductor layer 103*t* and the electric field strength decreases.

It is thus desirable that the impact ionization control layer 104 (the impact ionization control layer 104*f* and the impact ionization control layer 104*s*) be arranged closer to the channel defining compound semiconductor layer 106 than the middle between the base compound semiconductor layer 103*f* and the base compound semiconductor layer 103*t*.

In the present embodiment, the base compound semiconductor layer 103*f* has a film thickness of 3 μm, the base compound semiconductor layer 103*t* has a film thickness of 1 μm, and the impact ionization control layer 104*f*, the base compound semiconductor layer 103*s*, and the impact ionization control layer 104*s* have a film thickness of 50 nm. Also, the configuration is designed such that the impact ionization control layer 104*f* is sandwiched between the base compound semiconductor layer 103*f* and the base compound semiconductor layer 103*s*, and the impact ionization control layer 104*s* is sandwiched between the base compound semiconductor layer 103*s* and the base compound semiconductor layer 103*t*.

That is, it is desirable that the impact ionization control layer 104 be arranged closer to the channel defining compound semiconductor layer 106 than the middle (a position about 2 μm away from the ends of the layering range) of the layering range (the thickness Tst of the layering range=3 μm+50 nm+50 nm+50 nm+1 μm=4.15 μm) of the base compound semiconductor layer 103.

This configuration suppresses a reduction in the electric field strength in the base compound semiconductor layer 103*t* arranged on the channel defining compound semiconductor layer 106 side and allows impact ionization to occur with reliability in the vicinity of, for example, the drain region in the field-effect transistor, thus easily achieving a semiconductor device 100 having proper operating characteristics.

The base compound semiconductor layer 103*f*, the base compound semiconductor layer 103*s*, and the base compound semiconductor layer 103*t* are formed so that their total film thickness (approximately 4 μm) will be the thickness required to provide the required electric field strength. If the thickness of the base compound semiconductor layer 103 is insufficient for the required thickness, holes generated due to impact ionization collide with the gate insulating film 113*g* and fail to reach the source region, which makes it difficult to effect the function of the impact ionization control layer 104 (the impact ionization control layer 104*f* and the impact ionization control layer 104*s*).

In the semiconductor device 100, the first compound semiconductor (the base compound semiconductor layer 103) is GaN. Thus, a third compound semiconductor (InGaN such as $In_{0.1}Ga_{0.9}N$) that has a smaller band gap than GaN can be adopted as the impact ionization control layer 104.

Specifically, in the semiconductor device 100, the first compound semiconductor (the base compound semiconductor layer 103*f*, the base compound semiconductor layer 103*s*, and the base compound semiconductor layer 103*t*) is GaN, and the third compound semiconductor constituting the impact ionization control layer 104 (the impact ionization control layer 104*f* and the impact ionization control layer 104*s*) is InGaN. This configuration allows the base compound semiconductor layer 103 and the impact ionization control layer 104 to be formed with ease and high precision.

The intermediate layer 105 and the channel defining compound semiconductor layer 106 form a heterojunction HJ with the base compound semiconductor layer 103 (the base compound semiconductor layer 103*t*). That is, the channel defining compound semiconductor layer 106 is a barrier layer that provides a barrier against the two-dimensional electron gas layer 2DEG formed in the base compound semiconductor layer 103 (the base compound semiconductor layer 103*t*). This configuration allows easy formation of a highly concentrated two-dimensional electron gas layer 2DEG, thus achieving a semiconductor device 40 that is capable of operating at high frequency and high power.

The base compound semiconductor layer 103 (the base compound semiconductor layer 103*t*) is formed of GaN, the intermediate layer 105 is formed of AlN, and the channel defining compound semiconductor layer 106 is formed of AlGaN ($Al_{0.2}Ga_{0.8}N$). The band gap of GaN (the base compound semiconductor layer 103) is smaller than the band gaps of AlN (the intermediate layer 105) and AlGaN (the channel defining compound semiconductor layer 106). Accordingly, the channel defining compound semiconductor layer 106 serves as a barrier layer that provides a barrier against the two-dimensional electron gas layer 2DEG formed in the base compound semiconductor layer 103*t*.

Note that the two-dimensional electron gas layer 2DEG is formed in the base compound semiconductor layer 103*t* closer to the boundary with the intermediate layer 105 (the channel defining compound semiconductor layer 106). In other words, the two-dimensional electron gas layer 2DEG as a channel can be easily formed in the GaN layer constituting the base compound semiconductor layer 103 (the base compound semiconductor layer 103t).

The layering of the channel defining compound semiconductor layer 106 (the barrier layer) on the intermediate layer 105 that forms the heterojunction HJ with the base compound semiconductor layer 103t allows an electric field to be generated based on spontaneous polarization and piezopolarization, so that the two-dimensional electron gas layer 2DEG is formed in the channel defining compound semiconductor layer 106 closer to the boundary with the base compound semiconductor layer 103t. Also, the layering of the cap layer 109 allows control over the surface condition and the threshold value.

It is desirable that the distance between the impact ionization control layer 104 and the heterojunction HJ (the two-dimensional electron gas layer 2DEG) be in the range of 0.2 μm to 1.0 μm. This configuration reduces the generation of a leakage current caused by the impact ionization control layer 104 and accordingly allows effective absorption of electrons and holes generated due to impact ionization, thus providing the semiconductor device 100 with stable operating characteristics.

In the case where the distance between the impact ionization control layer 104 and the heterojunction HJ is smaller than 0.2 μm, there is a risk that the impact ionization control layer 104 and the drain region (the drain electrode 112) may be in too proximity to each other and accordingly the impact ionization control layer 104 may become a source of current leakage. In the case where the distance between the impact ionization control layer 104 and the heterojunction HJ is larger than 1.0 μm, there is a risk that the impact ionization control layer 104 and the drain region (the drain electrode 112) may be too away from each other and accordingly the impact ionization control layer 104 may not function well.

As described above, in the semiconductor device 100 according to the present embodiment, the first compound semiconductor, the second compound semiconductor, the third compound semiconductor are desirably nitride semiconductors. This configuration allows excellent characteristics of nitride semiconductors to be reflected, thereby providing the semiconductor device with excellent characteristics. Note that the first compound semiconductor, the second compound semiconductor, and the third compound semiconductor are not limited to nitride semiconductors, and it is possible to adopt compound semiconductors other than nitride semiconductors.

The components of the present embodiment may be combined as appropriate within the range of adaptation to the other embodiments.

Sixth Embodiment

A semiconductor device according to the present embodiment will be described with reference to FIG. 15. Note that the occurrence and effect of impact ionization are as described in the first to fifth embodiments and the basic configuration is identical to those of the semiconductor devices 20, 40, 60, and 100, different points are mainly described herein.

Figure 15:
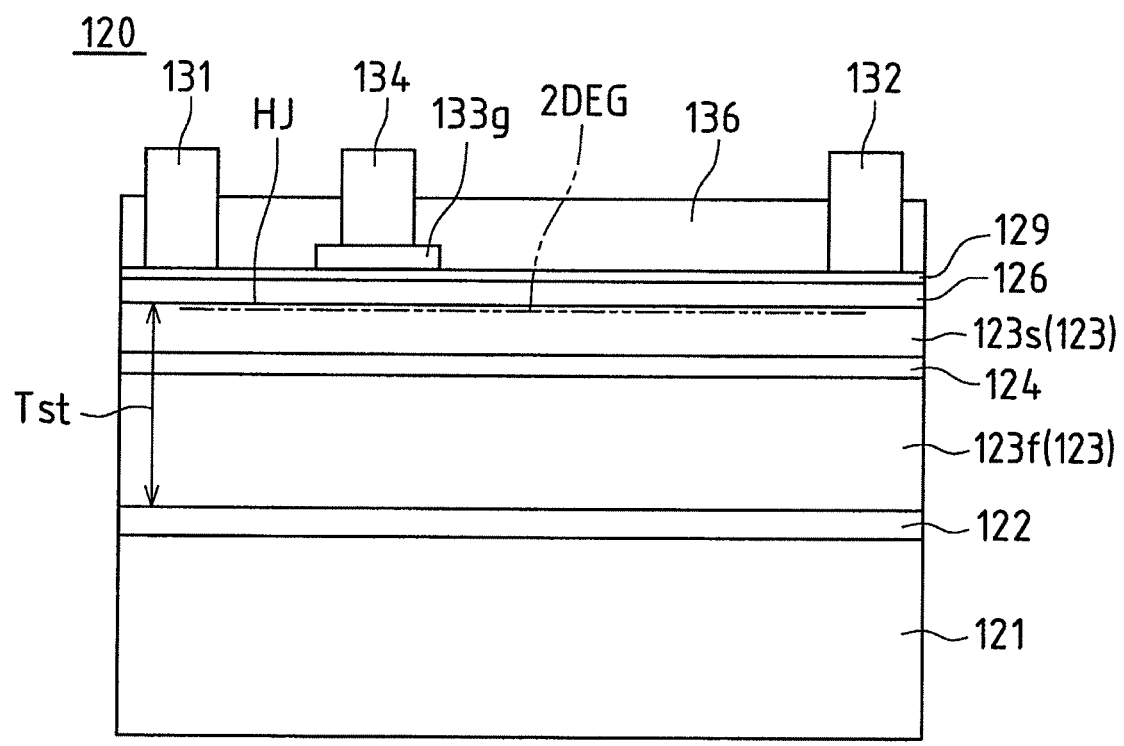
FIG. 15 is a diagrammatic cross-sectional view diagrammatically illustrating a general configuration of a semiconductor device according to a sixth embodiment of the present invention.

FIG. 15 is a diagrammatic cross-sectional view diagrammatically illustrating a general configuration of a semiconductor device according to a sixth embodiment of the present invention.

One example of a semiconductor device 120 according to the present embodiment is a field-effect transistor having a compound semiconductor MOS structure.

Note that, as will be described below, the semiconductor device 120 according to the present embodiment is also a variation of the semiconductor device 40 according to the second embodiment. The semiconductor device 40 includes a GaN layer as the base compound semiconductor layer 43 (the base compound semiconductor layer 43s) and an AlN layer as the intermediate layer 45, so that the channel defining compound semiconductor layer 46 (an AlGaN layer) and the cap layer 49 (a GaN layer) are layered on the intermediate layer 45. On the other hand, the semiconductor device 120 according to the present embodiment includes a GaN layer as the base compound semiconductor layer 123 (the base compound semiconductor layer 123s), on which the channel defining compound semiconductor layer 126 (the AlGaN layer) and the cap layer 129 (the GaN layer) are layered. That is, the intermediate layer 45 is not included in the configuration.

The semiconductor device 120 includes multiple layers layered in sequence on a substrate 121, namely a buffer layer 122, a base compound semiconductor layer 123f (base compound semiconductor layer 123), an impact ionization control layer 124, a base compound semiconductor layer 123s (base compound semiconductor layer 123), a channel defining compound semiconductor layer 126, and a cap layer 129.

In the following description, if no distinction is required between the base compound semiconductor layer 123f and the base compound semiconductor layer 123s, they may be simply referred to as the "base compound semiconductor layer 123".

The substrate 121 is a sapphire substrate having a (0001) crystal plane orientation, the buffer layer 122 is a GaN buffer layer having a film thickness of 20 nm, the base compound semiconductor layer 123f is a GaN layer having a film thickness of 3 μm, the impact ionization control layer 124 is an $In_{0.1}Ga_{0.9}N$ layer having a film thickness of 50 nm, the base compound semiconductor layer 123s is a GaN layer having a film thickness of 1 μm, the channel defining compound semiconductor layer 126 is an $Al_{0.2}Ga_{0.8}N$ layer having a film thickness of 20 nm, and the cap layer 129 is a GaN layer having a film thickness of 1 nm.

That is, the semiconductor device 120 according to the present embodiment includes the substrate 121, the base compound semiconductor layer 123 (the base compound semiconductor layer 123f and the base compound semiconductor layer 123s) that is layered on the substrate 121 to form a base, and the channel defining compound semiconductor layer 126 that is layered on the base compound semiconductor layer 123 to define a channel.

The semiconductor device 120 further includes the impact ionization control layer 124 that is layered within a layering range (a thickness Tst of the layering range) of the base compound semiconductor layer 123 and controls the location of impact ionization. The base compound semiconductor layer 123 is formed of a first compound semiconductor (GaN), the channel defining compound semiconductor layer 126 is formed of a second compound semiconductor (AlGaN), and the impact ionization control layer 124 is formed of a third compound semiconductor (InGaN such as $In_{0.1}Ga_{0.9}N$) that has a small band gap than the first compound semiconductor (GaN).

The semiconductor device 120 is thus capable of controlling the location of impact ionization with ease and high precision and thereby efficiently absorbing generated electrons and holes. That is, the holes generated in the vicinity of a drain electrode 132 due to impact ionization move toward a source electrode 131 along the interface between the buffer layer 122 and the base compound semiconductor layer 123f, and are absorbed into the source electrode 131. Meanwhile, the electrons generated due to impact ionization are absorbed into the drain electrode 132.

In other words, it is possible to reduce the influence of electrons and holes generated due to impact ionization on carrier signals and to thereby achieve proper operating characteristics and high reliability.

In the semiconductor device 120, the source electrode 131 and the drain electrode 132 are formed joined (by ohmic contact) to the cap layer 129. Thus, portions of the channel defining compound semiconductor layer 126 and the cap layer 129 that correspond to the source electrode 131 and the drain electrode 132 constitute a source region and a drain region. A gate insulating film 133g is layered and formed on the cap layer 129 between the source electrode 131 and the drain electrode 132, and a gate electrode 134 is overlaid over the gate insulating film 133g.

The gate insulating film 133g is formed of $SiO_2$ having a film thickness of 20 nm and the gate electrode 134 is formed by overlaying Ni having a film thickness of 50 nm over Au having a film thickness of 50 nm, so as to create a MOS type. That is, the semiconductor device 120 is a horizontal MOS field-effect transistor.

A surface protective film 136 that covers and protects the cap layer 129 (the semiconductor device 120) is formed between the source electrode 131, the drain electrode 132, and the gate electrode 134. The surface protective film 136 is SiNx deposited by plasma CVD and has a refractive index of, for example, 2.0.

The source electrode 131, the drain electrode 132, the gate insulating film 133g, the gate electrode 134, the surface protective film 136, and so on can be formed in the same manner as described in the first to fifth embodiments, so that the detailed description thereof will be omitted.

As described above, the semiconductor device 120 includes the gate insulating film 133g formed on the part of the channel defining compound semiconductor layer 126, the gate electrode 134 formed on the gate insulating film 133g, the source electrode 131 arranged on one side of the gate electrode 134, and the drain electrode 132 arranged on the other side of the gate electrode 134, facing to the source electrode 131.

With this configuration, the semiconductor device 120 (the field-effect transistor) is capable of controlling the location of impact ionization in the horizontal field-effect transistor and causing impact ionization to occur in the vicinity of the drain region before impact ionization occurs in a channel corresponding to the gate electrode 134. This accordingly enables the semiconductor device 120 to absorb electrons and holes generated in the vicinity of the drain region into the drain and the source, thus preventing the accumulation of holes in the channel due to impact ionization and thereby achieving proper operating characteristics.

If the film thickness of the base compound semiconductor layer 123f is greater than the film thickness of the base compound semiconductor layer 123s, impact ionization is less likely to occur in the vicinity of the drain region because an electric field spreads in the base compound semiconductor layer 123s and the electric field strength decreases.

It is thus desirable that the impact ionization control layer 124 be arranged closer to the channel defining compound semiconductor layer 126 than the middle between the base compound semiconductor layer 123f and the base compound semiconductor layer 123s.

In the present embodiment, the configuration is designed such that the base compound semiconductor layer 123f has a film thickness of 3 μm, the base compound semiconductor layer 123s has a film thickness of 1 μm, and the impact ionization control layer 124 has a film thickness of 50 nm and is sandwiched between the base compound semiconductor layer 123f and the base compound semiconductor layer 123s.

That is, it is desirable that the impact ionization control layer 124 be arranged closer to the channel defining compound semiconductor layer 126 than the middle (a position about 2 μm away from the ends of the layering range) of the layering range (the thickness Tst of the layering range=3 μm+50 nm+1 μm=4.05 μm) of the base compound semiconductor layer 123.

This configuration suppresses a reduction in the electric field strength in the base compound semiconductor layer 123s arranged on the side of the channel defining compound semiconductor layer 126 and allows impact ionization to occur with reliability in the vicinity of the drain region of the field-effect transistor, thus easily achieving a semiconductor device 120 having proper operating characteristics.

The base compound semiconductor layer 123f and the base compound semiconductor layer 123s are formed so that the total film thickness (4 μm) thereof will be the thickness required to provide the required electric field strength. If the thickness of the base compound semiconductor layer 123 is insufficient for the required thickness, the holes generated due to impact ionization collide with the gate insulating film 133g and fail to reach the source region, which makes it difficult to effect the function of the impact ionization control layer 124.

In the semiconductor device 120, the first compound semiconductor (the base compound semiconductor layer 123) is GaN. Thus, a third compound semiconductor (InGaN such as $In_{0.1}Ga_{0.9}N$) that has a smaller band gap than GaN can be adopted as the impact ionization control layer 124.

That is, in the semiconductor device 120, the first compound semiconductor (the base compound semiconductor layer 123f and the base compound semiconductor layer 123s) is GaN, and the third compound semiconductor constituting the impact ionization control layer 124 is InGaN. This configuration allows the base compound semiconductor layer 123 and the impact ionization control layer 124 to be formed with ease and high precision.

The channel defining compound semiconductor layer 126 forms a heterojunction HJ with the base compound semiconductor layer 123 (the base compound semiconductor layer 123s). That is, the channel defining compound semiconductor layer 126 is a barrier layer that provides a barrier against a two-dimensional electron gas layer 2DEG formed in the base compound semiconductor layer 123 (the base compound semiconductor layer 123s). This configuration allows easy formation of the highly concentrated two-dimensional electron gas layer 2DEG, thus achieving a semiconductor device 120 that is capable of operating at high frequency and high power.

The base compound semiconductor layer 123 (the base compound semiconductor layer 123s) is formed of GaN, and the channel defining compound semiconductor layer 126 is formed of AlGaN. The band gap of GaN (the base compound semiconductor layer 123) is smaller than the band gap of AlGaN (the channel defining compound semiconductor layer 126). Accordingly, the channel defining compound semiconductor layer 126 serves as a barrier layer that provides a barrier against the two-dimensional electron gas layer 2DEG formed in the base compound semiconductor layer 123s.

Note that the two-dimensional electron gas layer 2DEG is formed in the base compound semiconductor layer 123s closer to the boundary with the channel defining compound semiconductor layer 126. That is, the two-dimensional electron gas layer 2DEG as a channel can be easily formed in the GaN layer constituting the base compound semiconductor layer 123 (the base compound semiconductor layer 123s).

The layering of the channel defining compound semiconductor layer 126 (the barrier layer) that forms the heterojunction HJ with the base compound semiconductor layer 123s causes an electric field to be generated based on spontaneous polarization and piezopolarization, so that the two-dimensional electron gas layer 2DEG is formed in the base compound semiconductor layer 123s (the base compound semiconductor layer 123) closer to the boundary with the channel defining compound semiconductor layer 126. Also, the layering of the cap layer 129 allows control over the surface condition and the threshold value.

The distance between the impact ionization control layer 124 and the heterojunction HJ is desirably in the range of 0.2 μm to 1.0 μm. This configuration reduces the generation of a leakage current caused by an impact ionization control layer 124 and accordingly allows effective absorption of electrons and holes generated due to impact ionization, thus providing the semiconductor device 120 with stable operating characteristics.

In the case where the distance between the impact ionization control layer 124 and the heterojunction HJ is smaller than 0.2 μm, there is a risk that the impact ionization control layer 124 and the drain region (the drain electrode 132) may be in too close proximity to each other and thereby the impact ionization control layer 124 may become a source of current leakage. In the case where the distance between the impact ionization control layer 124 and the heterojunction HJ is larger than 1.0 μm, there is a risk that the impact ionization control layer 124 and the drain region (the drain electrode 132) may be too far away from each other and accordingly the impact ionization control layer 124 may not function well.

As described above, in the semiconductor device 120 according to the present embodiment, the first compound semiconductor, the second compound semiconductor, and the third compound semiconductor are desirably nitride semiconductors. This configuration allows excellent characteristics of nitride semiconductors to be reflected, thereby providing the semiconductor device with excellent characteristics. Note that the first compound semiconductor, the second compound semiconductor, and the third compound semiconductor are not limited to nitride semiconductors, and it is possible to adopt compound semiconductors other than nitride semiconductors.

The components of the present embodiment may be combined as appropriate within the range of adaptation to the other embodiments.

While the first to sixth embodiments according to the present invention have been described so far with reference to the drawings, it should be understood that the present invention is not limited to any of the examples provided above and the contents of description.

The present invention may be embodied in various other forms without departing from the spirit or essential characteristics thereof. The embodiments disclosed in this application are to be considered in all respects as illustrative and not limiting. The scope of the invention is indicated by the appended claims rather than by the foregoing description, and all modifications or changes that come within the meaning and range of equivalency of the claims are intended to be embraced therein.

DESCRIPTION OF REFERENCE NUMERALS 20 semiconductor device
21 substrate
22 buffer layer
23, 23f, 23s base compound semiconductor layer
24 impact ionization control layer
26 channel defining compound semiconductor layer
26f channel defining compound semiconductor layer (channel layer or channel)
26s channel defining compound semiconductor layer (barrier layer)
27 intermediate layer
29 cap layer
30s source region
30d drain region
31 source electrode
32 drain electrode
33 recessed portion
33g gate insulating film
34 gate electrode
40 semiconductor device
41 substrate
42 buffer layer
43, 43f, 43s base compound semiconductor layer
44 impact ionization control layer
45 intermediate layer
46 channel defining compound semiconductor layer (barrier layer)
49 cap layer
51 source electrode
52 drain electrode
53g gate insulating film
54 gate electrode
60 semiconductor device
61 substrate
62 buffer layer
63, 63f, 63s base compound semiconductor layer
64 impact ionization control layer
66 channel defining compound semiconductor layer (barrier layer)
71 source electrode
72 drain electrode
73g gate insulating film
74 gate electrode
80 semiconductor device
81 substrate
82 buffer layer
83, 83f, 83s base compound semiconductor layer
84 impact ionization control layer
85 intermediate layer
86 channel defining compound semiconductor layer (barrier layer)
89 cap layer
91 source electrode
92 drain electrode
93g gate insulating film
94 gate electrode
100 semiconductor device
101 substrate
102 buffer layer
103, 103f, 103s, 103t base compound semiconductor layer
104, 104f, 104s impact ionization control layer
105 intermediate layer
106 channel defining compound semiconductor layer (barrier layer)
109 cap layer 111 source electrode
112 drain electrode
113g gate insulating film
114 gate electrode
120 semiconductor device
121 substrate
122 buffer layer
123, 123f, 123s base compound semiconductor layer
124 impact ionization control layer
126 channel defining compound semiconductor layer (barrier layer)
129 cap layer
131 source electrode
132 drain electrode
133g gate insulating film
134 gate electrode
2DEG two-dimensional electron gas layer (channel)
HJ heterojunction
Tst thickness of layering range

What is claimed is:

1. A semiconductor device comprising:
    a substrate,
    a base compound semiconductor layer that is layered on the substrate to form a base, and
    a channel defining compound semiconductor layer that is layered on the base compound semiconductor layer to define a channel,
    wherein the channel defining compound semiconductor layer includes a barrier layer composed of AlGaN and a channel layer composed of GaN;
    the base compound semiconductor layer is formed of a semiconductor layer, the semiconductor layer being formed by layering a third compound semiconductor and a first compound semiconductor from a side of the substrate;
    the first compound semiconductor is composed of AlGaN; and
    the third compound semiconductor has a smaller band gap than the first compound semiconductor.

2. The semiconductor device according to claim 1, wherein a distance between a two-dimensional electron gas layer formed on the channel defining compound semiconductor layer and the third compound semiconductor is less than or equal to 1.0 μm.

3. The semiconductor device according to claim 1, further comprising:
    a buffer layer that is arranged between the substrate and the base compound semiconductor layer and provides crystal lattice matching,
    wherein the substrate is a non-isolating substrate and a thickness of a layering range of the base compound semiconductor layer is at least half a thickness of the buffer layer.

4. The semiconductor device according to any one of claims 1 to 3, comprising:
    a gate insulating film formed on the channel defining compound semiconductor layer;
    a gate electrode formed on the gate insulating film;
    a source electrode arranged on one side of the gate electrode; and
    a drain electrode arranged on the other side of the gate electrode, facing to the source electrode.

* * * * *